(12) United States Patent
Xie et al.

(10) Patent No.: US 10,170,544 B2
(45) Date of Patent: Jan. 1, 2019

(54) INTEGRATED CIRCUIT PRODUCTS THAT INCLUDE FINFET DEVICES AND A PROTECTION LAYER FORMED ON AN ISOLATION REGION

(71) Applicant: GLOBALFOUNDRIES Inc., Grand Cayman (KY)

(72) Inventors: Ruilong Xie, Niskayuna, NY (US); Christopher M. Prindle, Poughkeepsie, NY (US); Min Gyu Sung, Latham, NY (US); Tek Po Rinus Lee, Malta, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/833,285

(22) Filed: Dec. 6, 2017

(65) Prior Publication Data
US 2018/0102409 A1    Apr. 12, 2018

Related U.S. Application Data

(62) Division of application No. 15/197,944, filed on Jun. 30, 2016, now Pat. No. 9,876,077.

(51) Int. Cl.
| | | |
|---|---|---|
| *H01L 29/06* | (2006.01) | |
| *H01L 21/311* | (2006.01) | |
| *H01L 21/762* | (2006.01) | |
| *H01L 29/66* | (2006.01) | |
| *H01L 29/78* | (2006.01) | |

(52) U.S. Cl.
CPC .... *H01L 29/0649* (2013.01); *H01L 21/31111* (2013.01); *H01L 21/31144* (2013.01); *H01L 21/76224* (2013.01); *H01L 29/66795* (2013.01); *H01L 29/785* (2013.01)

(58) Field of Classification Search
CPC .......... H01L 29/0649; H01L 21/31111; H01L 21/31144; H01L 21/76224; H01L 29/66795; H01L 29/785
USPC ........................................................ 257/401
See application file for complete search history.

(56) References Cited

U.S. PATENT DOCUMENTS

2013/0277746 A1   10/2013   Baldauf et al.

*Primary Examiner* — Hrayr A Sayadian
(74) *Attorney, Agent, or Firm* — Amerson Law Firm, PLLC

(57) ABSTRACT

An integrated circuit product includes a FinFET device, a device isolation region that is positioned around a perimeter of the FinFET device, and an isolation protection layer that is positioned above the device isolation region. The FinFET device includes at least one fin, a gate structure, and a sidewall spacer, the device isolation region includes a first insulating material, and the isolation protection layer includes a material that is different from the first insulating material. A first portion of the isolation protection layer is positioned under a portion of the gate structure and under a portion of the sidewall spacer, wherein a second portion of the isolation protection layer is not positioned under the gate structure and is not positioned under the sidewall spacer, the first portion of the isolation protection layer having a thickness that is greater than a thickness of the second portion.

20 Claims, 21 Drawing Sheets

INTEGRATED CIRCUIT PRODUCTS THAT INCLUDE FINFET DEVICES AND A PROTECTION LAYER FORMED ON AN ISOLATION REGION

BACKGROUND

1. Field of the Disclosure

Generally, the present disclosure relates to the manufacture of semiconductor devices, and, more specifically, to various novel methods of forming a protection layer on an isolation region of integrated circuit products that include FinFET devices, and the resulting structures.

2. Description of the Related art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device includes drain and source regions and a gate electrode structure positioned above and between the source/drain regions. Upon application of an appropriate control voltage to the gate electrode, a conductive channel region forms between the drain region and the source region.

A conventional FET is a planar device wherein the entire channel region of the device is formed parallel and slightly below the planar upper surface of the semiconducting substrate. In contrast to a planar FET, there are so-called 3D devices, such as an illustrative FinFET device, which is a three-dimensional structure. FIG. 1A is a perspective view of an illustrative prior art FinFET semiconductor device 10 that is formed above a semiconductor substrate 12 wherein the fins 14 of the device 10 are made of the material of the substrate 12, e.g., silicon. The device 10 includes a plurality of fin-formation trenches 13, three illustrative fins 14, a gate structure 16, a sidewall spacer 18 and a gate cap layer 20. An insulating material 17 provides electrical isolation between the fins 14. The gate structure 16 typically includes of a layer of insulating material (not separately shown), e.g., a layer of high-k insulating material, and one or more conductive material layers that serve as the gate electrode for the device 10. The fins 14 have a three dimensional configuration: a height H, a width W and an axial length L. The axial length L corresponds to the gate length (GL) of the device, i.e., the direction of current travel in the device 10 when it is operational. The gate width (GW) of the device 10 is orthogonal to the gate length (GL) direction. The portions of the fins 14 covered by the gate structure 16 are the channel region of the FinFET device 10. The portions of the fins 14 that are positioned outside of the spacers 18 will become part of the source/drain regions of the device 10. Typically, additional epi semiconductor material (not shown) is formed on the portions of the fins 14 in the source/drain regions. A trench may or may not be formed in the fins 14 prior to the formation of the epi material. The epi material may be formed so as to result in merged or un-merged epi material in the source/drain regions.

Both FET and FinFET semiconductor devices have an isolation structure, e.g., a shallow trench isolation structure that is formed in the semiconducting substrate around the device so as to electrically isolate the semiconductor device from adjacent devices. Traditionally, isolation structures were always the first structure that was formed when manufacturing semiconductor devices. The isolation structures were formed by etching the trenches for the isolation structures and thereafter filling the trenches with the desired insulating material, e.g., silicon dioxide. After the isolation structures were formed, various process operations were performed to manufacture the semiconductor device. In the case of a FinFET device, this involved masking the previously formed isolation structure and etching the trenches in the substrate that defined the fins. As FinFET devices have been scaled to meet ever-increasing performance and size requirements, the width of the fins 14 has become very small, e.g., 6-12 nm, and the fin pitch has also been significantly decreased, e.g., the fin pitch may be on the order of about 30-60 nm.

However, as the dimensions of the fins became smaller, problems arose with manufacturing the isolation structures before the fins were formed. As one example, trying to accurately define very small fins in regions that were separated by relatively large isolation regions was difficult due to the non-uniform spacing between various structures on the substrate. One manufacturing technique that is employed in manufacturing FinFET devices is to initially etch the fin-formation trenches 13 in the substrate 12 to define multiple "fins" that extend across the entire substrate 12 (or area of the substrate where FinFET devices will be formed). Using this type of manufacturing approach, better accuracy and repeatability may be achieved in forming the fins 14 to very small dimensions due to the more uniform environment in which the etching process that forms the fin-formation trenches 13 is performed. After the fin-formation trenches 13 are formed, the isolation material 17 is formed between the fins 14 such that it substantially fills the fin-formation trenches 13. At that point, some portion of some of the fins 14 must be removed or cut to create room for or define the spaces where a device isolation region, e.g., an STI region, will ultimately be formed. This fin cutting process is typically performed by forming two different "fin cut" masking layers and performing a single etching process. After the fins are cut, additional insulation isolation material 17 is formed between the remaining fins 14 and in the spaces that were formerly occupied by the removed fins. Next, a timed recess etching process was then performed on the insulating material 17 so as to "reveal" the desired final fin height of the remaining fins. As a result of these process operations, so-called local isolation regions are formed between the fins 14, and a device isolation region, e.g., an STI region, is formed around the FinFET device so as to electrically isolate the device from adjacent FinFET devices. Importantly, in this prior art process flow, the fin cutting process was performed prior to performing the fin reveal process, i.e., prior to performing the recess etching process on the insulating material 17.

FIG. 1B is a cross-sectional view taken through a fin 14 of a prior art integrated circuit product in a gate length direction of the FinFET device. Also depicted is an isolation region 28 that was filled with the insulation material 17, which is typically silicon dioxide. Depending upon the particular application, the depth of the isolation region may be the same as or deeper than the depth of the fin-formation trenches 13. Also depicted in FIG. 1B is a plurality of epi semiconductor material regions 30 that are formed in the fin 14 between adjacent gates, i.e., in the source/drain regions of the devices. In this example, after the gate was formed, trenches were etched into the fin 14 and the epi semiconductor material 30 was then deposited into the trenches in the fin 14.

Several acid-based etching or cleaning processes are performed on the product over the course of forming the various structures that make up the FinFET devices. For example, a plurality of wet HF based cleaning processes may be performed at various times to remove an undesirable material, such as native oxide layers, prior to or after performing a process operation. By way of example, such acid-based cleaning processes are typically performed prior to formation of the epi semiconductor materials 30. Unfortunately, the isolation structure 28, which is typically silicon dioxide, is also subject to attack during these cleaning processes. Additionally, even if an etching or cleaning process is performed that is not purposefully intended to remove silicon dioxide, e.g., a spacer etch process when the spacer material is silicon nitride, the silicon dioxide material 17 in the isolation structure 28 is still subject to some degree of attack. As a result, as shown in FIG. 1B, the net result of performing all of these acid-based cleaning and etching processes is that relatively large divots or holes 32 may be formed in the isolation structure 28. In some cases, the divots 32 may become large enough such that the foundational support for the gates is lost to at least some degree. As indicated, the gates are intended to have a generally vertical orientation 31. But, due to the formation of the divots 32, the gates may actually tilt or "flip-over," as reflected by the line 33, from their desired vertical orientation 31. One of the gates in FIG. 1B is depicted in dashed lines so as to simplistically represent such a "tilted gate." Such tilting of the gates, if sufficient, may lead to significant degradation of the performance of the IC product.

The present disclosure is directed to various novel methods of forming a protection layer on an isolation region of integrated circuit products that include FinFET devices and the resulting structures that may resolve, or at least reduce, one or more of the problems identified above.

SUMMARY OF THE DISCLOSURE

The following presents a simplified summary of the disclosure in order to provide a basic understanding of some aspects of the subject matter that is described in further detail below. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally, the present disclosure is directed to various novel methods of forming a protection layer on an isolation region of integrated circuit products that include FinFET devices and the resulting structures. One illustrative embodiment of an integrated circuit product disclosed herein includes, among other things, a FinFET device, a device isolation region that is positioned around a perimeter of the FinFET device, and an isolation protection layer that is positioned above the device isolation region. The FinFET device includes at least one fin, a gate structure, and a sidewall spacer, the device isolation region includes a first insulating material, and the isolation protection layer includes a material that is different from the first insulating material. Additionally, a first portion of the isolation protection layer is positioned under a portion of the gate structure and under a portion of the sidewall spacer, wherein a second portion of the isolation protection layer is not positioned under the gate structure and is not positioned under the sidewall spacer. Furthermore, the first portion of the isolation protection layer has a thickness that is greater than a thickness of the second portion.

Also disclosed herein is an exemplary integrated circuit product that includes a FinFET device having at least one fin, a gate structure positioned on the at least one fin, and a sidewall spacer positioned adjacent to the gate structure. Additionally, the disclosed integrated circuit product includes a device isolation region that is positioned around a perimeter of the FinFET device, the device isolation structure including a first insulating material, and an isolation protection layer that is positioned above the device isolation region, the isolation protection layer including a material that is different from the first insulating material. Furthermore, a first portion of the isolation protection layer is positioned under a portion of the gate structure and under a portion of the sidewall spacer, wherein a second portion of the isolation protection layer is not positioned under the gate structure and is not positioned under the sidewall spacer. Moreover, the isolation protection layer has a substantially stepped cross-sectional profile such that a thickness of the first portion of the isolation protection layer is greater than a thickness of the second portion.

In yet another exemplary embodiment of the present disclosure, an integrated circuit product includes a FinFET device having at least one fin, a gate structure positioned on the at least one fin, and a sidewall spacer positioned adjacent to the gate structure. Additionally, the disclosed integrated circuit product further includes a recessed layer of a first insulating material positioned under the gate structure and adjacent to the at least one fin and a device isolation region positioned around a perimeter of the FinFET device, the device isolation structure including a second insulating material. Moreover, an isolation protection layer is positioned above the device isolation region, the isolation protection layer including a material that is different from the second insulating material, wherein a first portion of the isolation protection layer is positioned under a portion of the gate structure and under a portion of the sidewall spacer, and wherein a second portion of the isolation protection layer is not positioned under the gate structure and is not positioned under the sidewall spacer. Furthermore, the isolation protection layer has a substantially stepped cross-sectional profile when viewed in cross-sections that are taken through the gate structure and the isolation protection layer in both a gate width direction and a gate length direction of the FinFET device.

BRIEF DESCRIPTION OF THE DRAWINGS

The disclosure may be understood by reference to the following description taken in conjunction with the accompanying drawings, in which like reference numerals identify like elements, and in which.

Figure 1A:
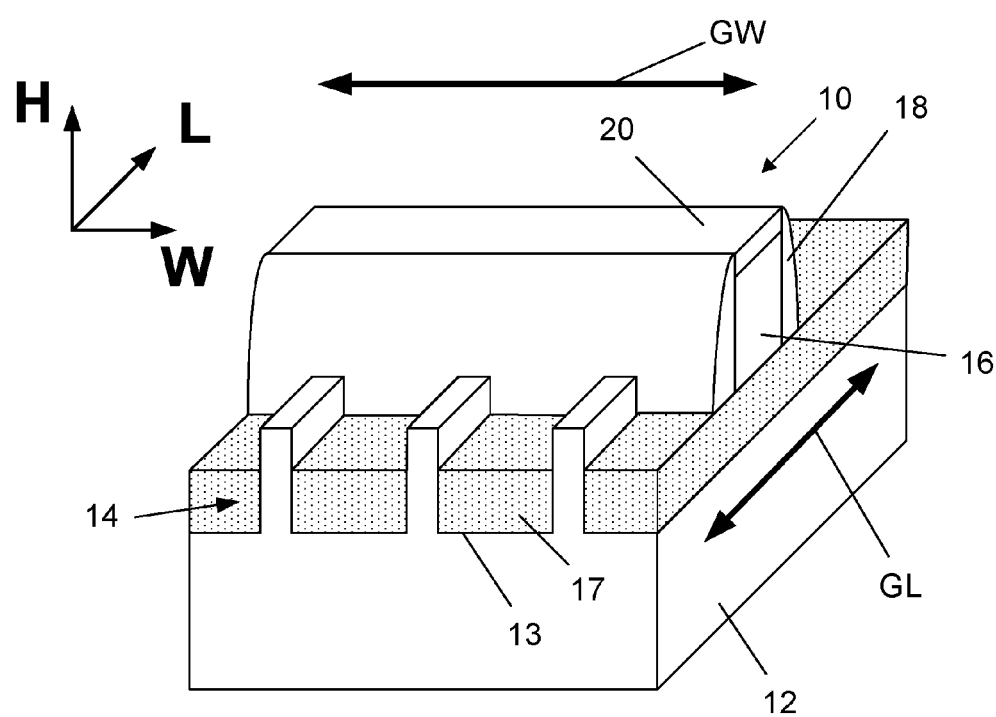
FIG. 1A is a perspective view of an illustrative prior art FinFET device.
Figure 1B:
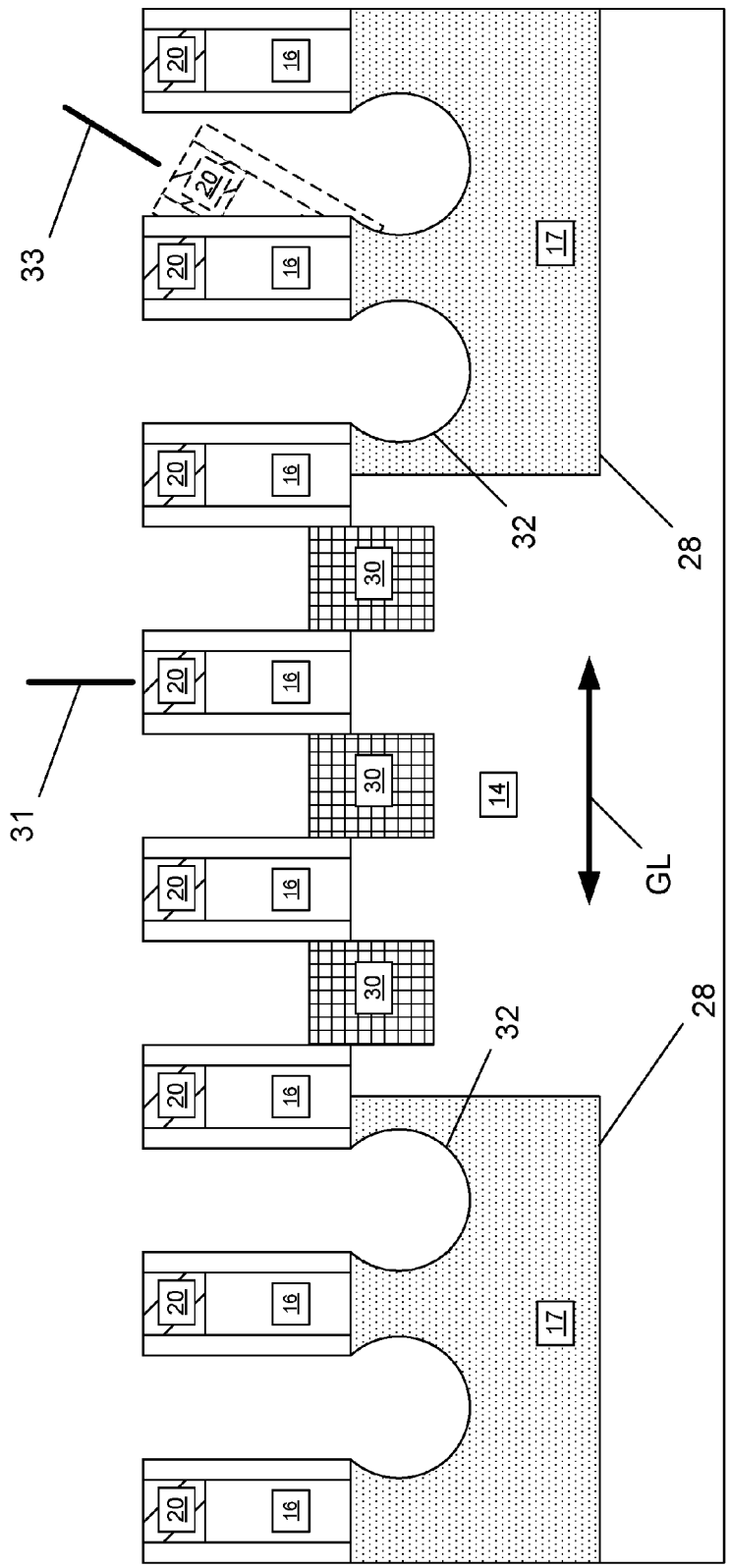
FIG. 1B is a cross-sectional view taken through a fin of a prior art integrated circuit product having a plurality of gates.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the subject matter defined by the appended claims to the particular forms disclosed, but on the contrary, the intention is to cover all modifications, equivalents, and alternatives falling within the spirit and scope of the claimed subject matter.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various systems, structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the methods disclosed herein may be employed in manufacturing a variety of different devices, including, but not limited to, logic devices, memory devices, etc., and the devices may be may be either NMOS or PMOS devices.

As used in this description and in the appended claims, the terms "substantial" or "substantially" are intended to conform to the ordinary dictionary definition of that term, meaning "largely but not wholly that which is specified." As such, no geometrical or mathematical precision is intended by the use of terms such as "substantially flat," "substantially perpendicular," "substantially parallel," "substantially circular," "substantially elliptical," "substantially rectangular," "substantially square," "substantially aligned," and/or "substantially flush," and the like. Instead, the terms "substantial" or "substantially" are used in the sense that the described or claimed component or surface configuration, position, or orientation is intended to be manufactured, positioned, or oriented in such a configuration as a target. For example, the terms "substantial" or "substantially" should be interpreted to include components and surfaces that are manufactured, positioned, or oriented as close as is reasonably and customarily practicable within normally accepted tolerances for components of the type that are described and/or claimed. Furthermore, the use of phrases such as "substantially conform" or "substantially conforms" when describing the configuration or shape of a particular component or surface, such as by stating that "the configuration of the component substantially conforms to the configuration of a rectangular prism," should be interpreted in similar fashion.

Furthermore, it should be understood that, unless otherwise specifically indicated, any relative positional, directional, or spatial references that may be used in the descriptions set forth below—such as "upper," "lower," "above," "below," "over," "under," "top," "bottom," "vertical," "horizontal," "lateral," and the like—may be used for convenience when referring to structures of semiconductor devices. These references are intended to be used in a manner consistent with the drawings only for teaching purposes, and are not intended as absolute references for semiconductor device structures. For example, FETs or memory devices may be oriented spatially in any manner different from the orientations shown in the drawings. "Vertical" is used to refer to a direction normal to the semiconductor layer surface, and "horizontal" is used to refer to a direction parallel to the semiconductor layer surface when referring to the drawings. "Upper" is used to refer to a vertical direction away from the semiconductor layer. An element positioned "above" ("below") another one is located farther away from (closer to) the semiconductor layer surface as compared to the other one.

As will be appreciated by those skilled in the art after a complete reading of the present application, various doped regions, e.g., source/drain regions, halo implant regions, well regions and the like, are not depicted in the attached drawings. Of course, the subject matter disclosed herein should not be considered to be limited to the illustrative examples depicted and described herein. The various components and structures of the integrated circuit devices 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

Figure 2A:
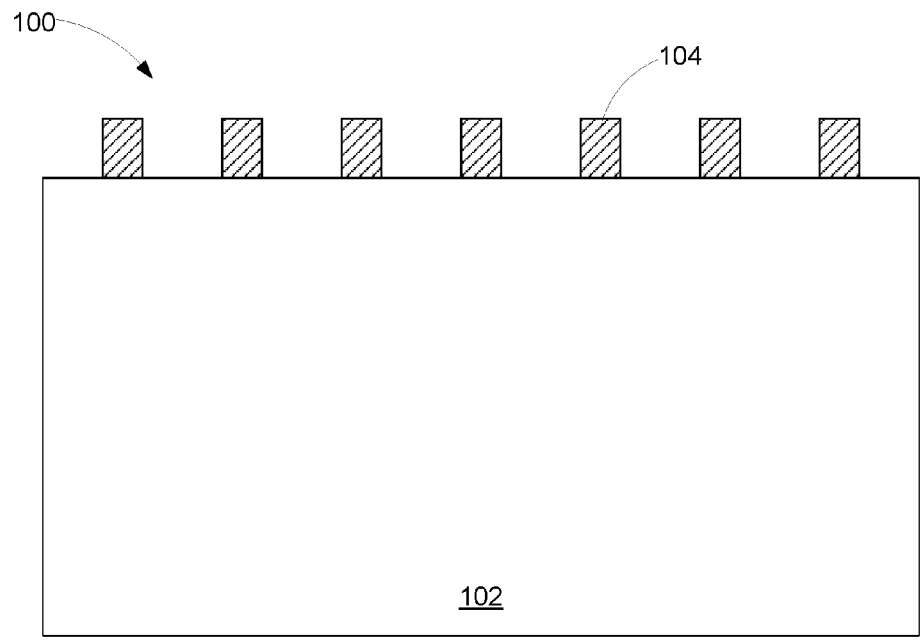
FIGS. 2A-2R depict various illustrative novel methods disclosed herein for forming a protection layer on an isolation region of integrated circuit products that include FinFET devices.
Figure 2B:
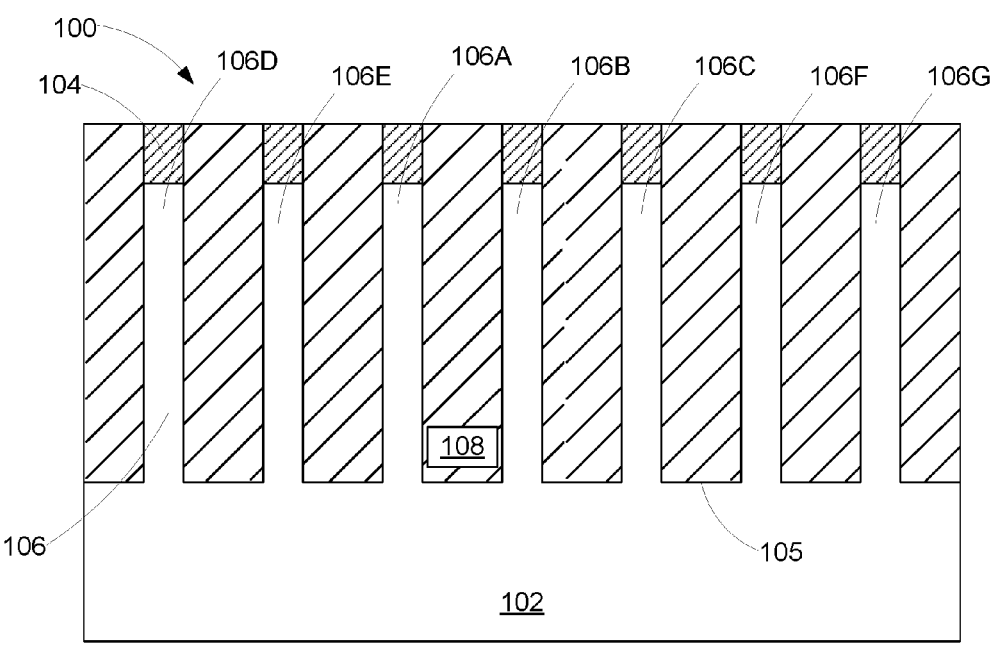
Figure 2C:
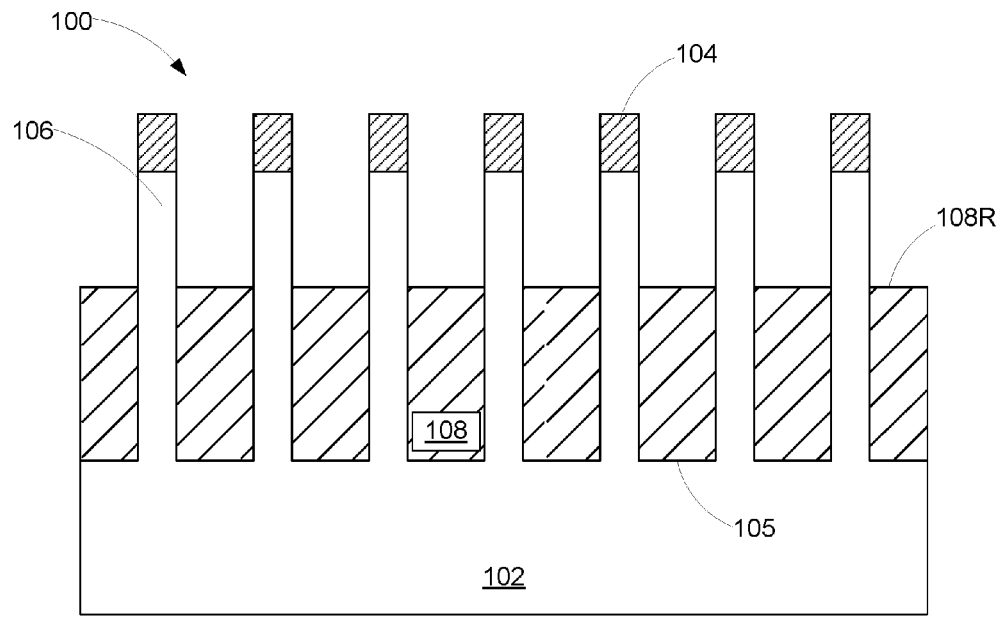
Figure 2D:
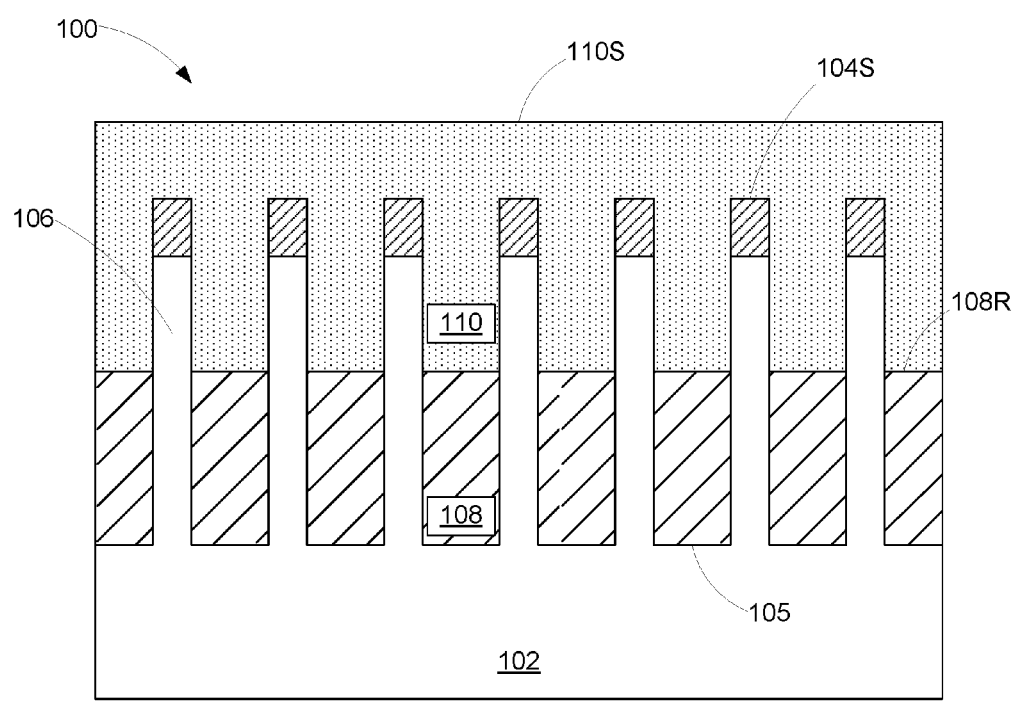
Figure 2E:
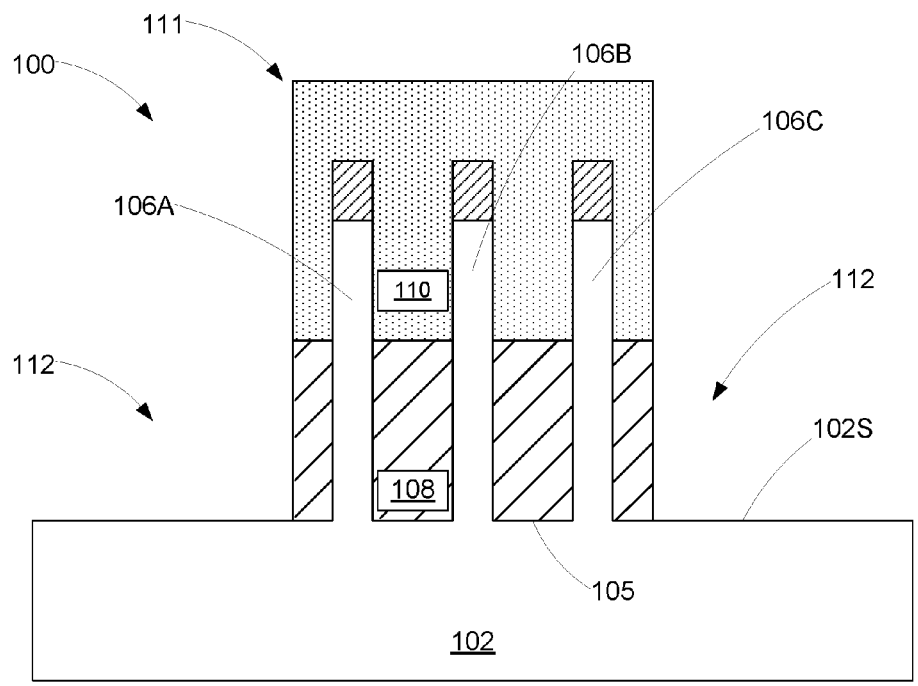
Figure 2F:
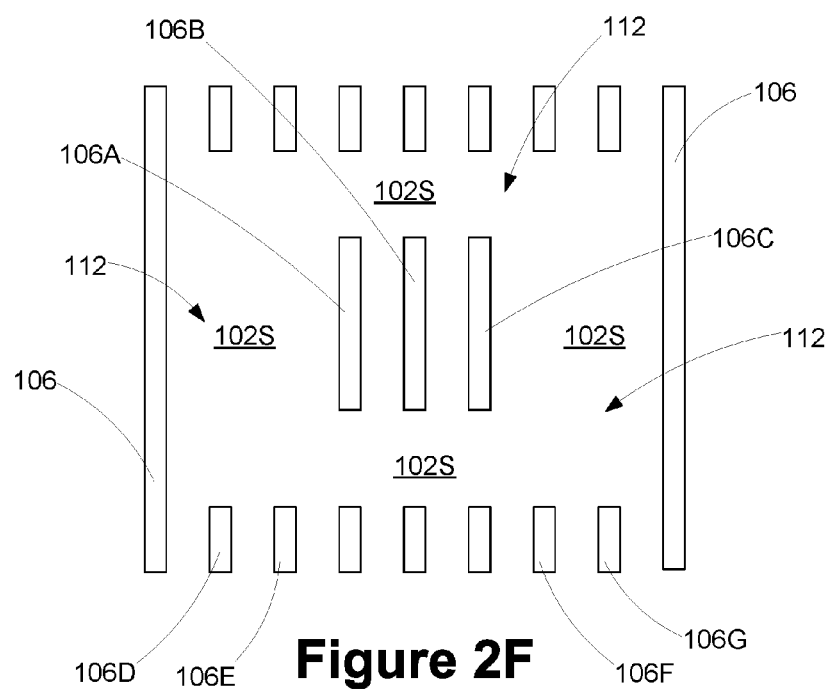
Figure 2G:
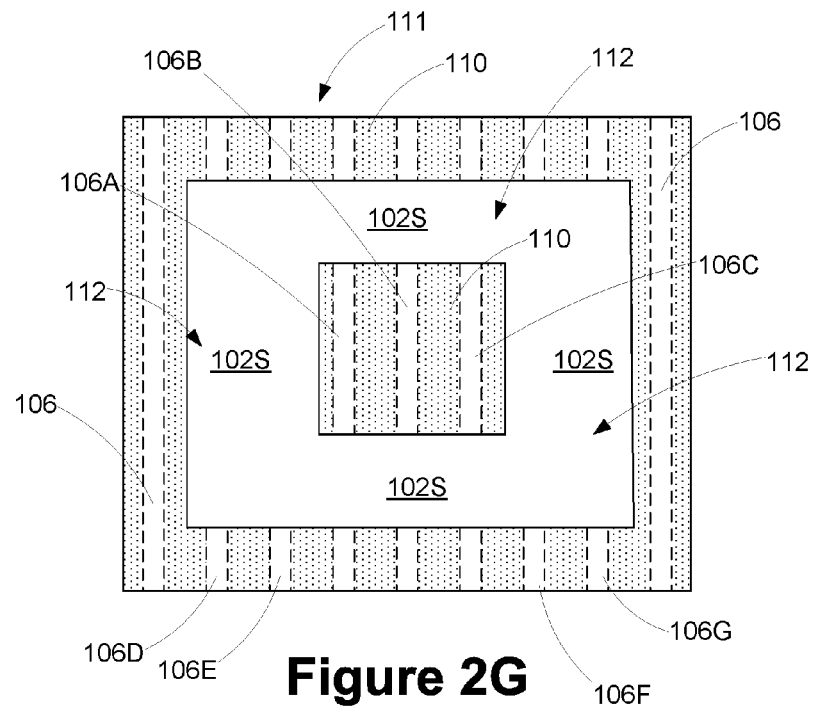
Figure 2H:
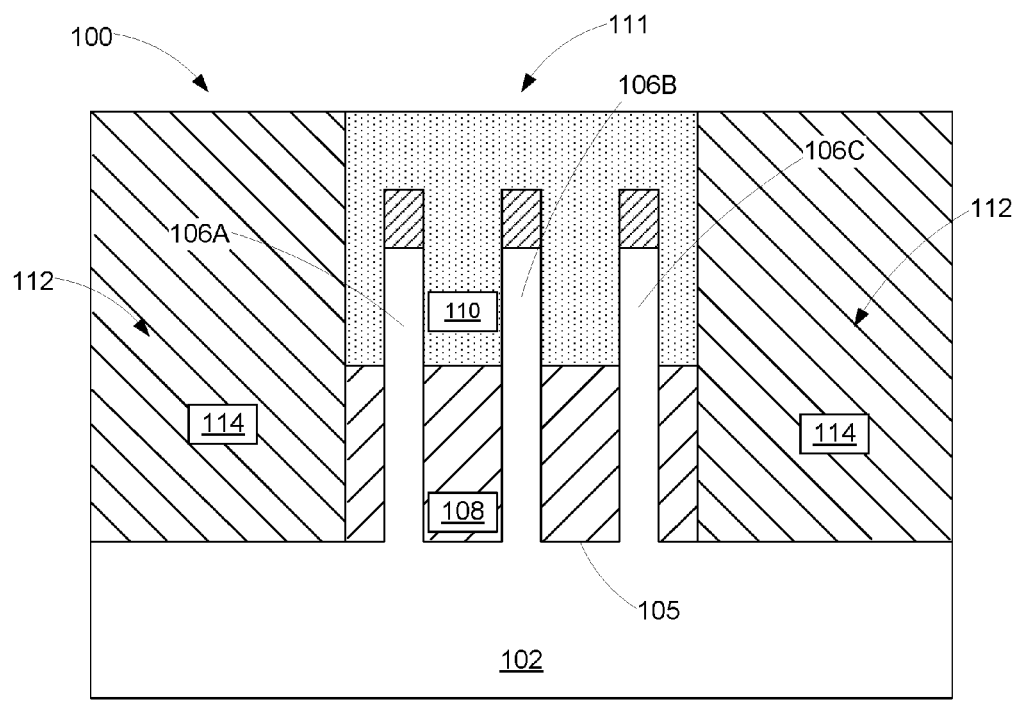
Figure 2I:
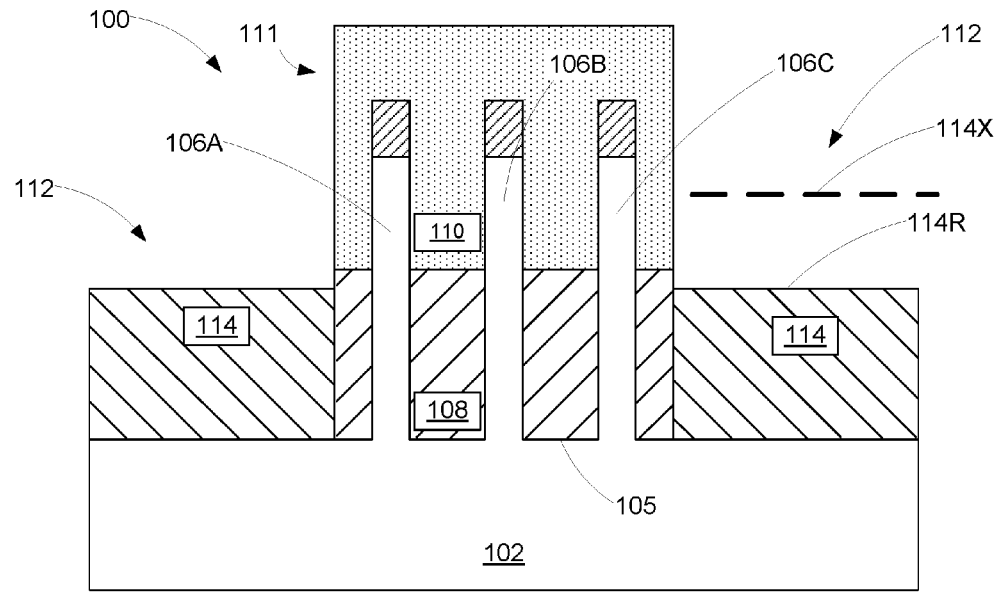
Figure 2J:
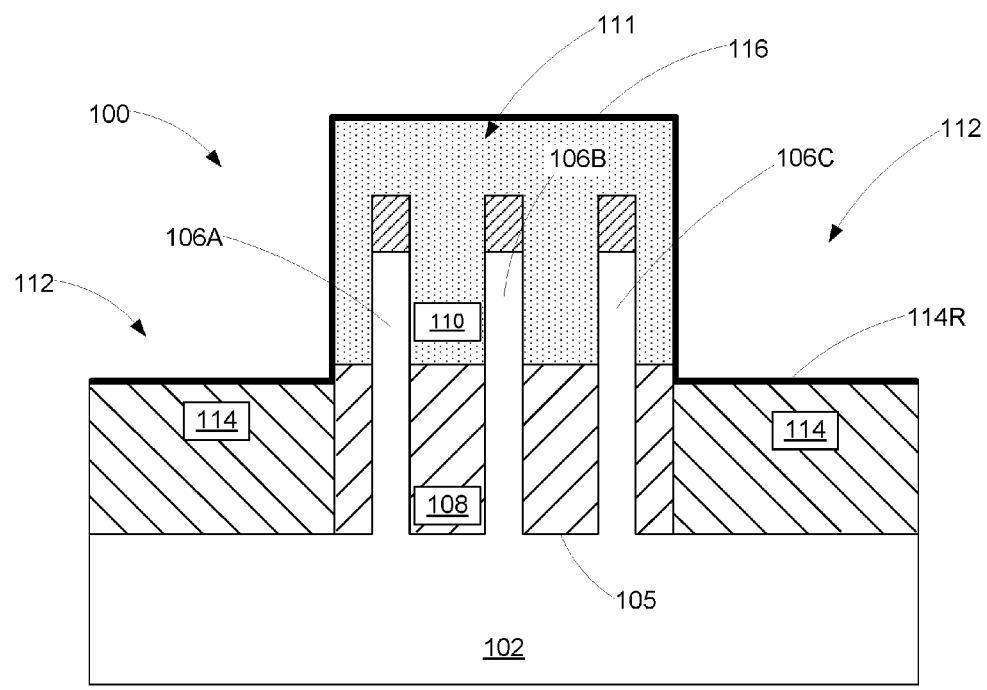
Figure 2K:
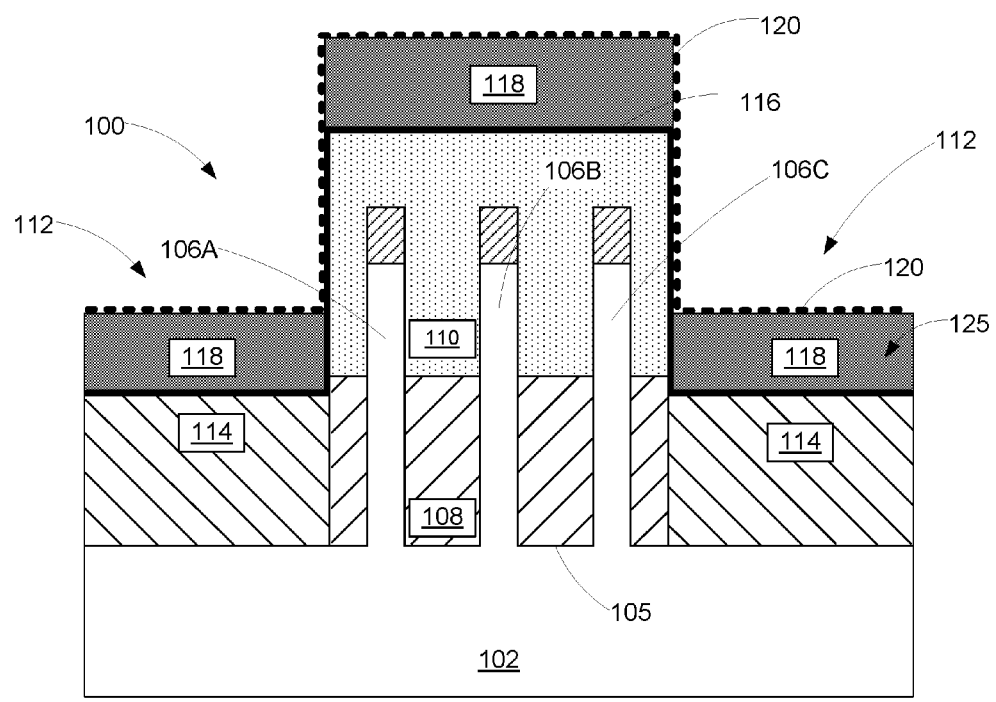
Figure 2L:
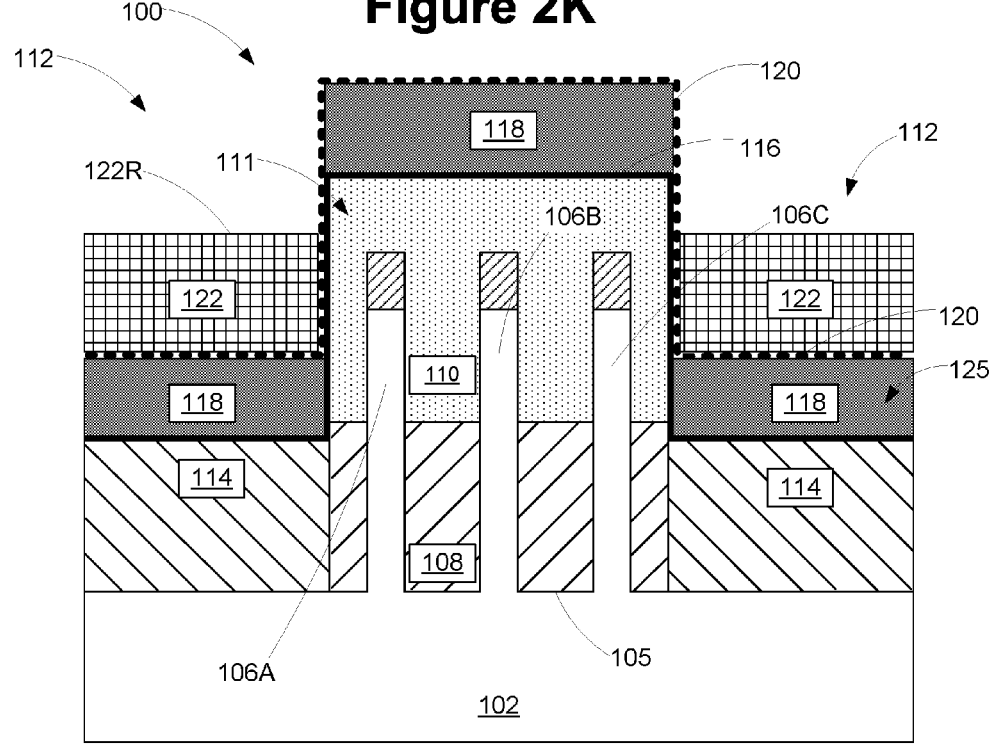
Figure 2M:
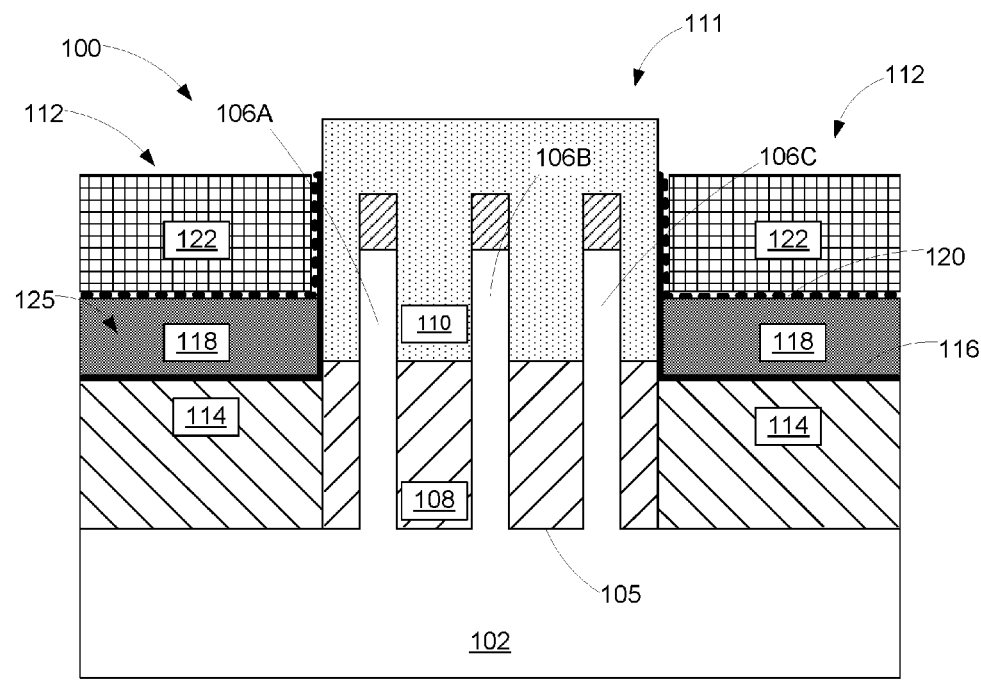
Figure 2N:
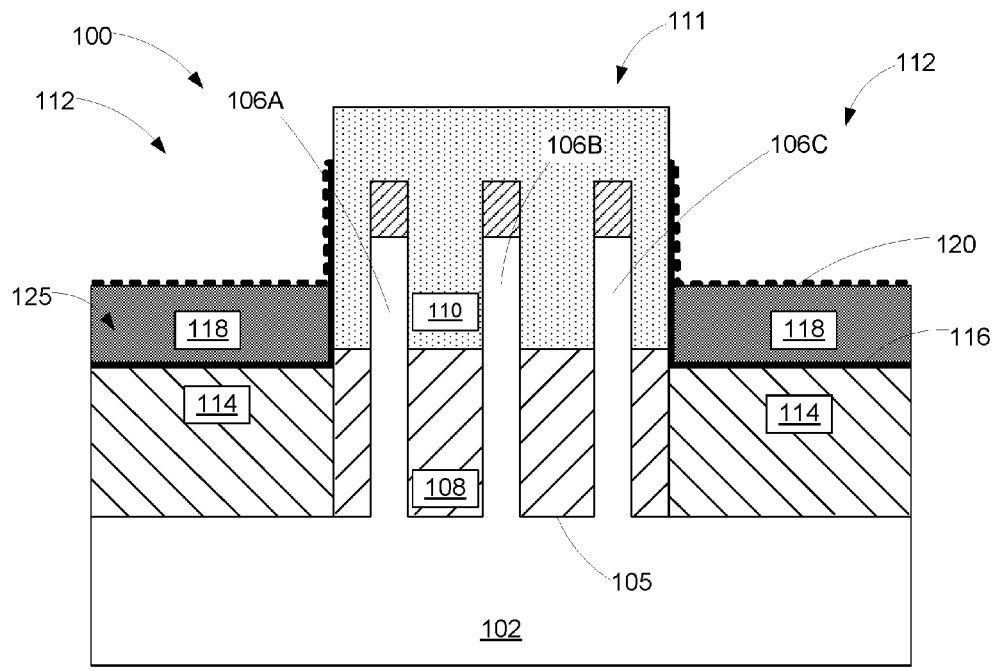
Figure 2O:
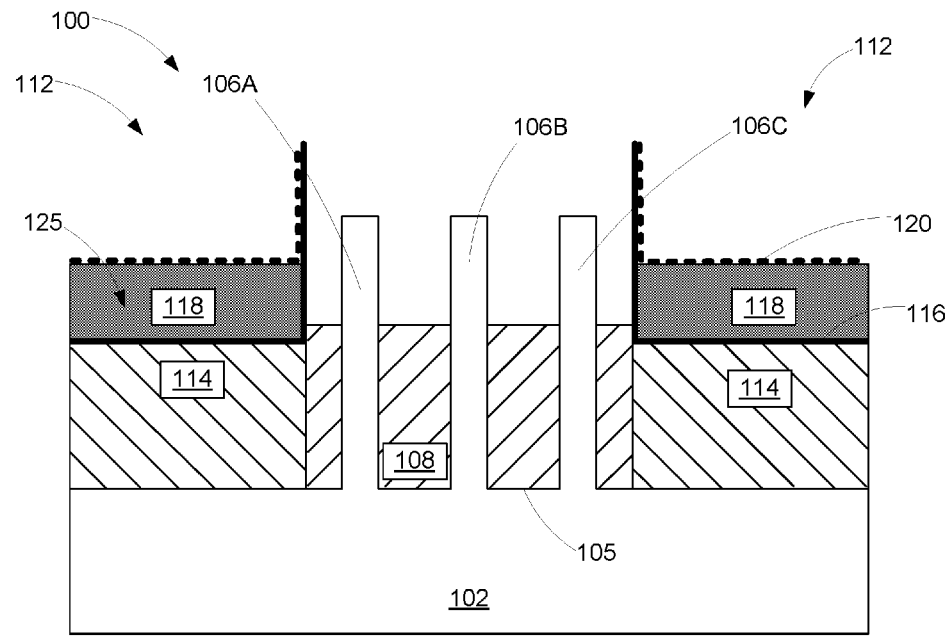
Figure 2P:
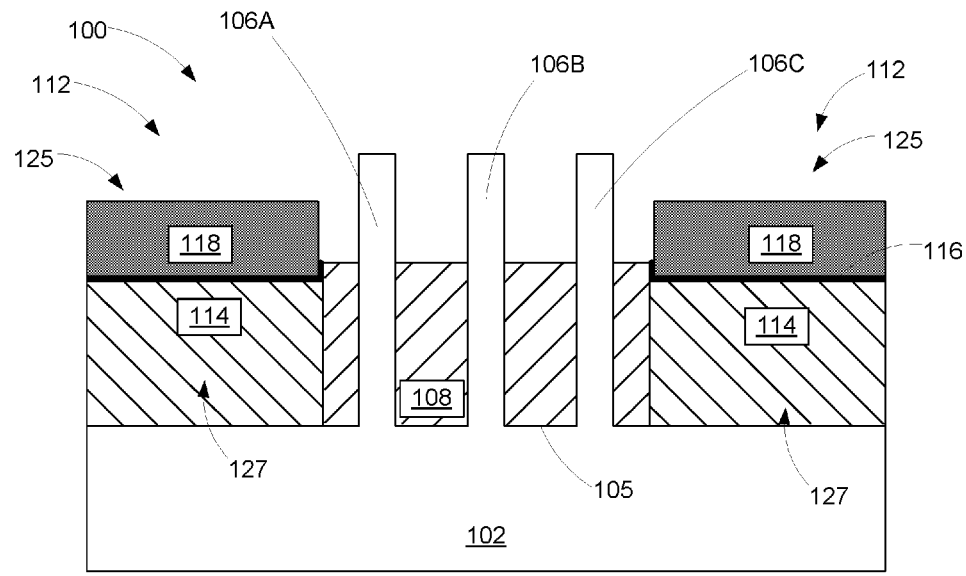
Figure 2Q:
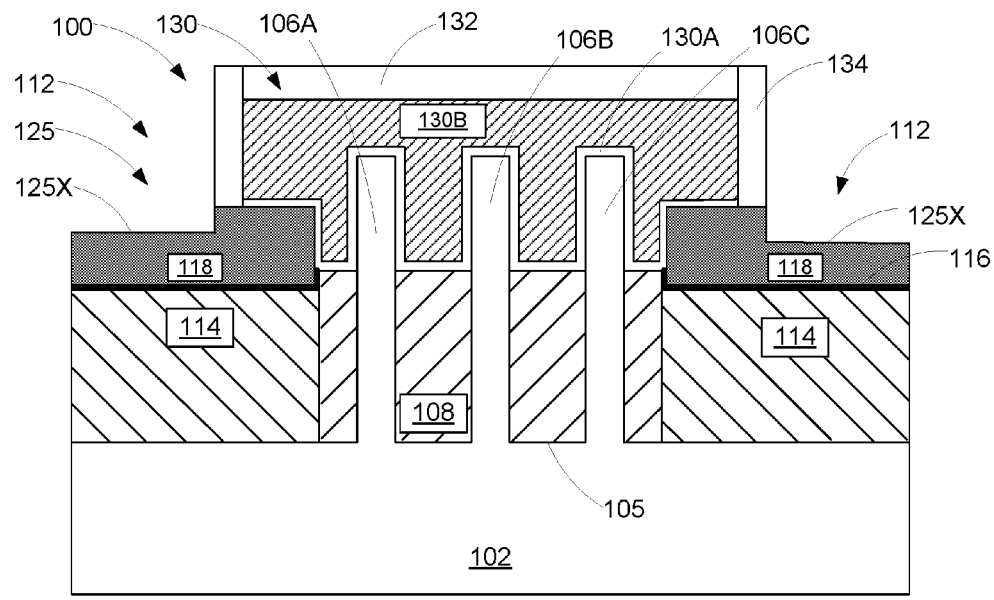
Figure 2R:
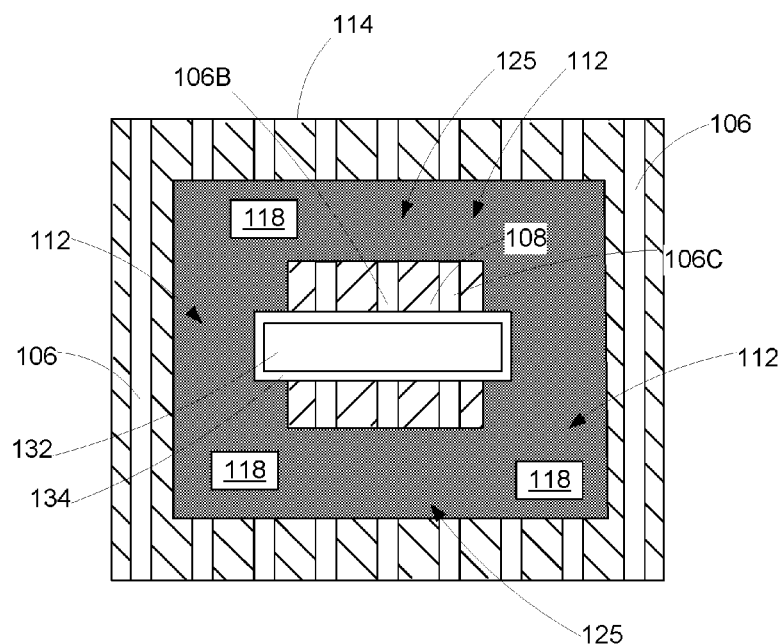

FIGS. 2A-2R depict various illustrative novel methods disclosed herein for forming a protection layer on an isolation region of an integrated circuit product 100 that includes FinFET devices. In the examples depicted herein, the integrated circuit product 100 will be formed in and above a semiconductor substrate 102. The substrate 102 may have a variety of configurations, such as a semiconductor-on-insulator (SOI) configuration that includes a bulk semiconductor layer, a buried insulation layer and an active semiconductor layer. Alternatively, the substrate may have a simple bulk configuration. The substrate 102 may be made of silicon or it may be made of materials other than silicon, e.g., silicon-germanium, a III-V compound semiconductor material, etc. Thus, the terms "substrate" or "semiconductor substrate" should be understood to cover all semiconducting materials and all forms of such materials.

FIG. 2A depicts the product 100 at a point in fabrication wherein several process operations have been performed. First, a patterned fin-formation etch mask 104, e.g., a combination of a silicon dioxide layer (e.g., a pad oxide—not separately shown) and a silicon nitride layer (e.g., a pad nitride—not separately shown) was formed above the substrate 102. In some cases, the pad oxide layer may be omitted if desired.

FIG. 2B depicts the product 100 after several process operations were performed. First, one or more etching processes were performed through the patterned fin-formation etch mask 104 so as to define a plurality of fin-formation trenches 105 in the substrate 102. These one or more etching processes result in the formation of a plurality of fins 106 (A-G). Next, a layer of insulating material 108 was deposited so as to over-fill the trenches 105 with the insulating material 108. Then, a planarization process, such as a chemical mechanical planarization (CMP) process, was performed on the layer of insulating material 108 that stopped on the upper surface of the patterned fin-formation hard mask 104. The illustrative FinFET device disclosed herein will be depicted as having three illustrative active fins 106A, 106B and 106C. However, as will be recognized by those skilled in the art after a complete reading of the present application, the methods and devices disclosed herein may be employed when manufacturing FinFET devices having any number of fins.

With continuing reference to FIG. 2B, the overall size, shape and configuration of the fin-formation trenches 105 and the fins 106 may vary depending on the particular application. The depth and width of the trenches 105 may vary depending upon the particular application. In one illustrative embodiment, based on current-day technology, the overall depth (relative to the upper surface of the substrate 102) of the fin-formation trenches 105 may range from approximately 60-200 nm. In the illustrative examples depicted in the attached figures, the trenches 105 and the fins 106 will be simplistically depicted as having generally rectangular portions and sections. In an actual real-world device, the sidewalls of the fins 106 may be somewhat outwardly tapered (i.e., the fins may be wider at the bottom of the fin than they are at the top of the fin), although that configuration is not depicted in the attached drawings. Thus, the size and configuration of the trenches 105 and the fins 106, and the manner in which they are made, should not be considered a limitation of the present invention. For ease of disclosure, only the substantially rectangular-shaped trenches 105 and fins 106 having a substantially rectangular-shaped cross-sectional configuration will be depicted in the drawings.

FIG. 2C depicts the product 100 after a timed, recess etching process—a "fin reveal" etching process—was performed on the layer of insulating material 108 so as to recess the insulating material 108 to a desired height level within the trenches 105. As depicted, the layer of insulating material 108 has a recessed upper surface 108R that exposes the desired final fin height of the fins 106 above the insulating material 108.

FIG. 2D depicts the product 100 after several process operations were performed. First, a conformal deposition process, such as an ALD process, was performed to form a relatively thin (e.g., 2-4 nm) conformal layer of silicon dioxide (not shown) on the recessed upper surface 108R of the layer of insulating material 108, on the sidewalls of the fins 106 and around the features of the patterned fin-formation hard mask 104. Then, a sacrificial layer of material 110 was formed so as to over-fill the remaining portions of the trenches 105 such that its upper surface 110S is positioned at a level that is above the level of the upper surface 104S of the patterned fin-formation hard mask 104. A CMP process may be performed on the layer of material 110 if desired. In one illustrative embodiment, the layer of material 110 should be made of a material that exhibits good etch selectivity to silicon dioxide, a material such as silicon nitride, silicon oxynitride, SiBCN, etc.

As shown in FIGS. 2E-2G, the next major process operation involves removing portions of the fins 106 so as to define an isolation region opening 112 where a device isolation structure will be formed around the perimeter of the FinFET device. First, several etching processes were performed through a patterned masking layer (not shown), e.g., a patterned layer of photoresist, that was formed above the sacrificial layer of material 110. The patterned masking layer covers the area above the portions of the fins 106A-C that will become the active fins of the FinFET device. The patterned masking layer also has an opening that is located above an area where portions of the laterally adjacent fins 106D-G and portions of the fins 106A-C will be removed to define the isolation region opening 112 for the device isolation region that will be formed around the perimeter of the FinFET device. For example, in one illustrative process flow, a first etching process was performed through the patterned masking layer to remove the portion of the sacrificial layer of material 110, the portion of the silicon dioxide liner layer (not shown) and the portion of the patterned fin formation masking layer 104 positioned under the opening in the patterned masking layer. The first etching process stops on the insulation material 108. This first etching process results in the formation of a patterned fin masking layer 111. In this illustrative embodiment, the patterned fin masking layer 111 may include portions of the sacrificial layer of material 110. The patterned fin masking layer 111 is positioned above or covers the portions of the fins 106A-C that will become part of the FinFET device and contains an opening that corresponds to the isolation region opening 112 where the device isolation region will be formed, i.e., the pattern in the patterned masking layer is transferred to the patterned fin masking layer 111.

With continuing reference to FIGS. 2E-2G, at this point, if desired, the patterned masking layer may be removed. Then, a second etching process was performed to remove the exposed portions of the fins 106 within the isolation region opening 112. In the depicted example, the entire vertical height of the exposed portions of the fins 106 was removed. Next, a third etching process was performed to remove the exposed portions of the insulation material 108 within the isolation region opening 112. The result of all of these process operations is that the isolation region opening 112 for a device isolation region is formed around the perimeter of the FinFET device and that portions of the upper surface 102S of the substrate 102 is exposed. FIG. 2F is a simplistic plan view of the product 100 after the fins 106 have been cut and removed. FIG. 2F does not depict any of the various layers of material present above the substrate 102, only the fins 106 and the substrate 102 are depicted. FIG. 2G is a simplistic plan view of the product 100 wherein the patterned fin masking layer 111 (i.e., the remaining portions of the sacrificial layer of material 110) is depicted and wherein the remaining fins 106 are depicted in dashed lines. As depicted a greater axial length of the laterally adjacent fins 106D-G were removed as compared to the axial length of the fins 106A-C. At the completions of this fin removal process, which may involve performing two separate fin cut etching processes or a single fin cut etching process, the illustrative active fins 106A, 106B and 106C for the FinFET device will have been cut to the desired final axial length.

FIG. 2H depicts the product 100 after several process operations were performed. First, a layer of insulating material 114 was deposited so as to over-fill the isolation region opening 112 for the device isolation region. Then, a planarization process, such as a CMP process, was performed on the layer of insulating material 114 that stopped on the upper surface of the patterned fin masking layer 111. In one illustrative embodiment, the layer of insulating material 114 may be a material that is the same as that of the layer of insulating material 108, e.g., they both may be silicon dioxide, but, in some applications, the materials of the layers 108, 114 may be different.

FIG. 2I depicts the product 100 after a timed, recess etching process was performed on the layer of insulating material 114 so as to recess the insulating material 114 to a desired height level within the isolation region opening 112. As depicted, the layer of insulating material 114 has a recessed upper surface 114R. The amount of recessing of the layer of insulation material 114 may vary depending upon the particular application. For example, the layer of insulting material 114 may be recessed such that its recessed upper surface 114R is positioned at the level indicated by the dashed line 114X.

FIG. 2J depicts the product 100 after a conformal deposition process, such as an ALD process, was performed to form a relatively thin (e.g., 2-4 nm) conformal layer of silicon dioxide 116 on the recessed upper surface 114R of the layer of insulating material 114 and on the upper surface and sides of the patterned fin masking layer 111.

FIG. 2K depicts the product 100 after several process operations were performed. First, a directional deposition process, such as a gas cluster ion beam (GCIB) process, was performed to form a layer of isolation protection material 118 on the substantially horizontally oriented surfaces, i.e., to form a first portion of the isolation protection material 118 above the patterned fin masking layer 111 and to form a second portion of the isolation protection material 118 in the isolation region opening 112 above the layer of silicon dioxide 116. In general, during such a directional deposition process, little, if any, of the deposited material forms on the substantially vertically oriented surfaces. The thickness of the as-formed layer of isolation protection material 118 may vary depending upon the particular application, e.g., 10-30 nm. In one illustrative embodiment, the layer of isolation protection material 118 should be made of a material that exhibits good etch selectivity to silicon dioxide, e.g., a material such as silicon nitride, silicon oxynitride, SiBCN, etc. In one illustrative embodiment, the layer of isolation protection material 118 may be of a material that is the same as that of the sacrificial layer of material 110, e.g., they both may be made of silicon nitride, but, in some applications, the materials of the layers 118, 110 may be different. After forming the layer of isolation protection material 118, another conformal deposition process, such as an ALD process, was performed to form a relatively thin (e.g., 2-4 nm) conformal layer of material 120. The conformal layer of material 120 is depicted with a dashed line so as to distinguish it from the conformal layer of silicon dioxide 116. The conformal layer of material 120 should be made of a material that may be selectively etched relative to the layer of isolation protection material 118 and the conformal layer of silicon dioxide 116. In one illustrative embodiment, the conformal layer of material 120 may be of a material having a dielectric constant greater than about 10, e.g., hafnium oxide, etc.

FIG. 2L depicts the product 100 after several process operations were performed. First, a layer of masking material 122, such as SOH, OPL, etc., was deposited so as to substantially fill the remaining portions of the isolation region opening 112. Then, a timed, recess etching process was performed on the layer of masking material 122 such that it has a recessed upper surface 122R. The amount of recessing of the layer of masking material 122 may vary depending upon the particular application. In general, the recessed upper surface 122R should be positioned at level that is below the upper surface of the patterned fin masking layer 111.

FIG. 2M depicts the product after several process operations were performed. First, an etching process was performed to remove exposed portions of the conformal layer of material 120. The etching process exposes the portion of the layer of isolation protection material 118 positioned above the patterned fin masking layer 111 and above the fins 106. Then, another etching process was performed to remove the exposed first portion of the layer of isolation protection material 118. Next, another etching process was performed to remove the exposed portions of the conformal layer of silicon dioxide 116.

FIG. 2N depicts the product after an etching process was performed to remove the layer of masking material 122.

FIG. 2O depicts the product 100 after several processing operations were performed. First, an etching process was performed to remove the patterned fin masking layer 111. At this point, the patterned fin-formation masking layer 104 is protected by a thin conformal layer of silicon dioxide (not shown). To the extent that this thin layer of silicon dioxide remains intact after the patterned fin masking layer 111 is removed, a brief etching process is performed to remove the conformal layer of silicon dioxide and thereby expose the patterned fin-formation masking layer 104. Next, another etching process was performed to remove the patterned fin-formation masking layer 104 and to expose the upper surface and sidewalls of the fins 106A-C.

FIG. 2P depicts the product after one or more etching processes were performed to remove the exposed portion of the conformal layer of silicon dioxide 116 and the conformal layer of material 120. As depicted, in this embodiment, the remaining portions of the layer of isolation protection material 118 constitute an isolation protection layer 125 that is positioned above an isolation region 127. The isolation region 127 may include at least the insulating material 114 positioned in the isolation region opening 112.

At the point of processing depicted in FIG. 2P, the FinFET device may be completed using traditional fabrication techniques. For example, FIG. 2Q depicts the product after an illustrative and representative gate structure 130, a gate cap layer 132 and a sidewall spacer 134 were formed. Of course, the materials of construction for the gate structure 130 of an NMOS device may be (and likely will be) different from the gate structure of a PMOS device. In one illustrative embodiment, the schematically depicted gate structure 130 includes an illustrative gate insulation layer 130A and an illustrative gate electrode 130B. The gate insulation layer 130A may be any one or more of a variety of different materials, such as, for example, silicon dioxide, a so-called high-k insulation material having a k value greater than 10 (where k is the relative dielectric constant), etc. Similarly, the gate electrode 130B may also be of a material such as polysilicon or amorphous silicon, or it may include of one or more metal layers that act as the gate electrode 130B. As will be recognized by those skilled in the art after a complete reading of the present application, the gate structure 130 of the FinFET device depicted in the drawings, i.e., the gate insulation layer 130A and the gate electrode 130B are intended to be representative in nature. That is, the gate structure 130 may be of a variety of different materials and it may have a variety of configurations. The gate structure 130 may be manufactured using either the so-called "gate-first" or "replacement gate" techniques. After the gate structure 130 is formed, other processing activities may also be performed, e.g., the formation of doped halo implant regions (not shown), doped source/drain regions (not shown), the formation of epi semiconductor material (not shown) in the source/drain regions, etc.

As depicted in FIG. 2Q, in one illustrative embodiment where the sidewall spacer 134 and the isolation protection layer 125 are of the same (or a similar) material, such as silicon nitride, a notch or recess 125X is formed in the isolation protection layer 125 when the anisotropic etching process is performed to form the spacer 134, such that the isolation protection layer 125 has a substantially stepped configuration due to the presence of the notch 125X. That is, in the cross-sectional view shown in FIG. 2Q (through the gate in the gate width direction of the device), the portions of the isolation protection layer 125 positioned under the sidewall spacer 134 and the gate structure 130 are thicker (in a direction that is substantially perpendicular to an upper surface of the insulating material 114) than the portions of the isolation protection layer 125 that are not covered by the spacer 134 or the gate structure 130. As discussed more fully below, the isolation protection layer 125 also has this same substantially stepped configuration when viewed in a cross-section taken through a fin and the gate in a gate length direction of the device. Importantly, in the illustrative process flow depicted herein, the "fin-reveal" process, i.e., the recessing of the layer of insulating material 108, was performed prior to removing the fins in the areas occupied by the device isolation region 127.

FIG. 2R is a simplistic plan view of the product 100 after the gate has been formed. As depicted, the isolation protection layer 125 is positioned above the insulating material 114 that constitutes the device isolation structure 127. In this particular example, the isolation protection layer 125 may be silicon nitride so as to protect the underlying silicon dioxide insulation material 114 in the device isolation structure 127 as subsequent processing proceeds on the device, thereby eliminating or at least reducing the formation of the divots in the isolation material as discussed in the background section of this application.

Figure 3A:
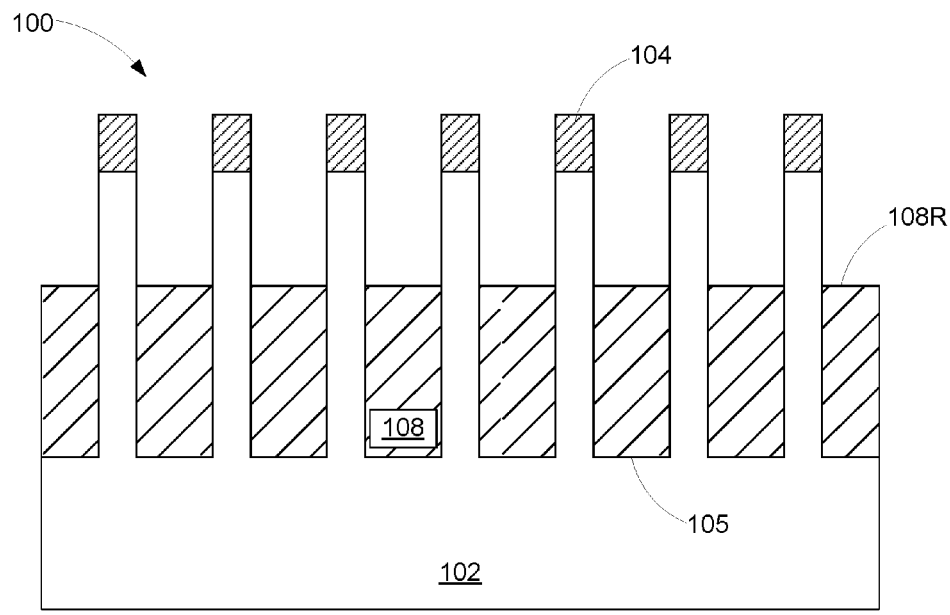
FIGS. 3A-3I depict other illustrative novel methods disclosed herein for forming a protection layer on an isolation region of integrated circuit products that include FinFET devices.

FIGS. 3A-3I depict other illustrative novel methods disclosed herein for forming a protection layer on an isolation region of integrated circuit products that include FinFET devices. FIG. 3A depicts the device at a point in processing that corresponds to that shown in FIG. 2C, i.e., after the above-described timed, recess etching process was performed on the layer of insulating material 108 so as to recess the insulating material 108 to a desired height level within the trenches 105.

Figure 3B:
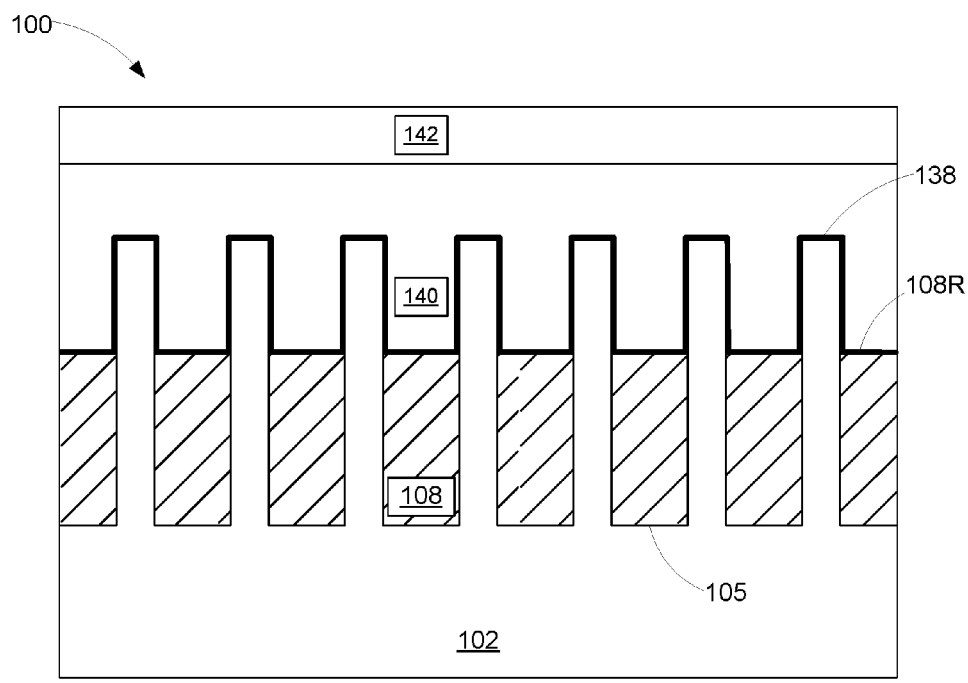

FIG. 3B depicts the product 100 after several process operations were performed. First, an etching process was performed to remove the patterned fin formation hard mask 104. Then, a conformal deposition process, such as an ALD process, was performed to form a relatively thin (e.g., 2-4 nm) conformal layer of silicon dioxide 138. Next, a sacrificial layer of material 140, such as amorphous silicon or polysilicon, and a sacrificial layer of material 142, e.g., silicon nitride, was blanket-deposited across the substrate 102. The materials 140, 142 may be formed to any desired thickness.

Figure 3C:
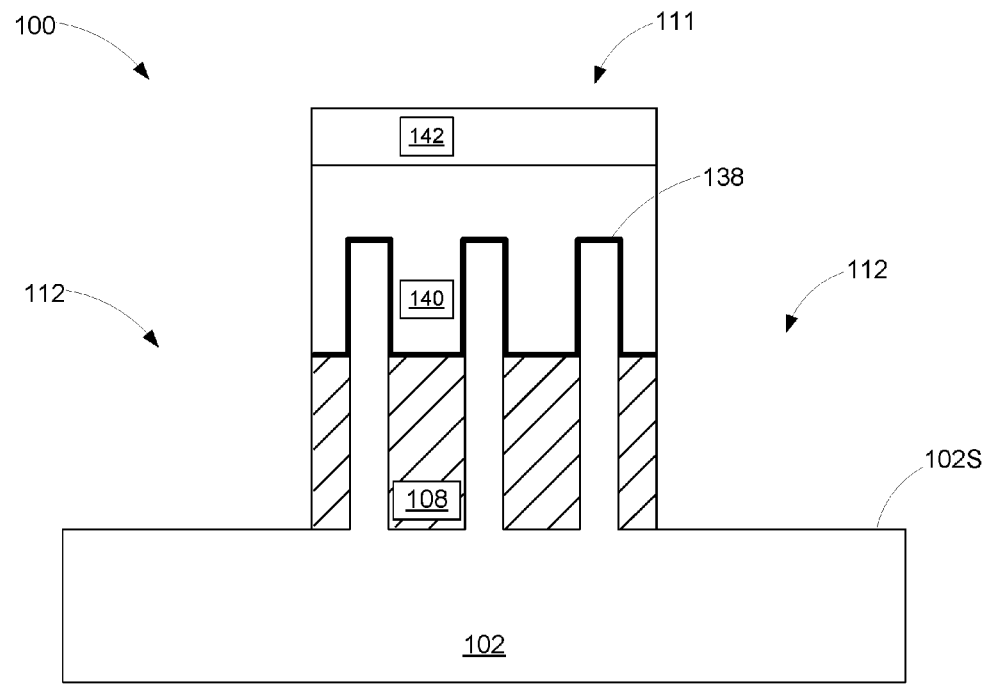

FIG. 3C depicts the product 100 after the above-described masking and etching processes were performed to remove various layers of material and portions of the fins 106 so as to define the isolation region opening 112 where the device isolation structure 127 will be formed around the FinFET device. In this example, a first etching process was performed through a patterned masking layer (not shown), e.g., a patterned layer of photoresist, to remove the exposed portions of sacrificial layer 142. The patterned masking layer may be removed at this point in the process flow if desired. Thereafter, another etching process was performed to remove the exposed portions of the sacrificial layer of material 140 that stops on the silicon dioxide liner layer 138. These etching processes result in the formation of another version of the patterned fin masking layer 111. In this illustrative embodiment, the patterned fin masking layer 111 may include a portion of the sacrificial layer of material 142 and a portion of the sacrificial layer of material 140.

Next, another etching process was performed to remove the silicon dioxide liner layer 138 and expose the portions of the fins 106 that are to be removed. This latter etching process stops on the portions of the insulation material 108 positioned within the isolation region opening 112. Then, yet another etching process was performed to remove the exposed portions of the fins 106. In the depicted example, the entire vertical height of the exposed portions of the fins 106 was removed. Next, a final etching process was performed to remove the exposed portions of the insulation material 108. The result of all of these process operations is that the isolation region opening 112 for the device isolation region 127 is formed around the perimeter of the FinFET device and exposes portions of the upper surface 102S of the substrate 102.

Figure 3D:
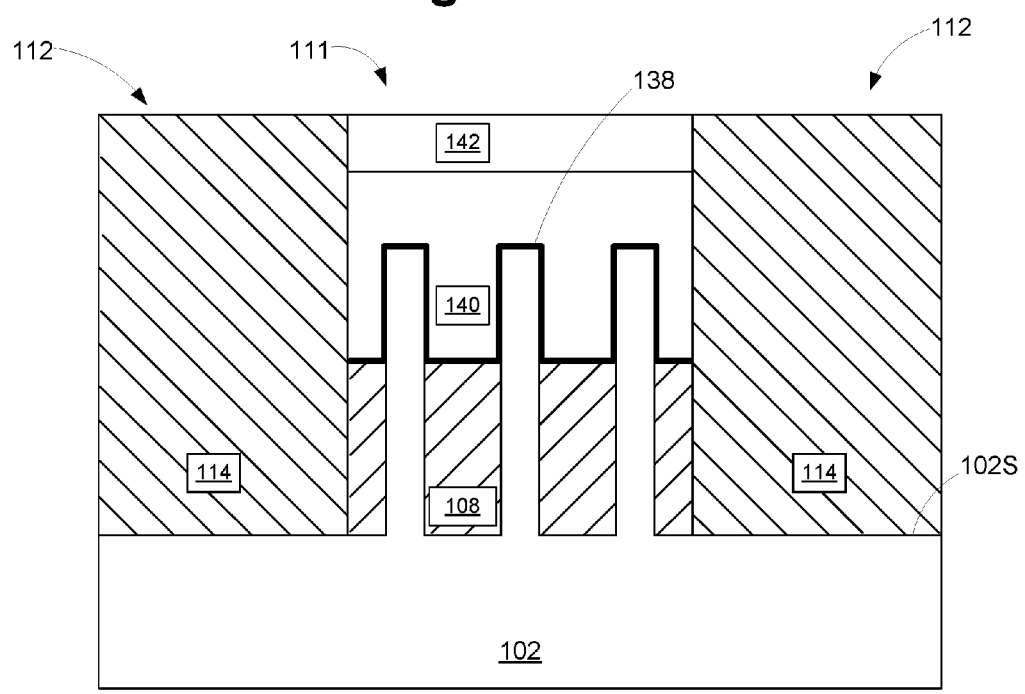

FIG. 3D depicts the product 100 after the above-described layer of insulating material 114 was formed in the isolation region opening 112 and after a CMP process was performed on the layer of insulating material 114 that stopped on the upper surface of the sacrificial layer of material 142.

Figure 3E:
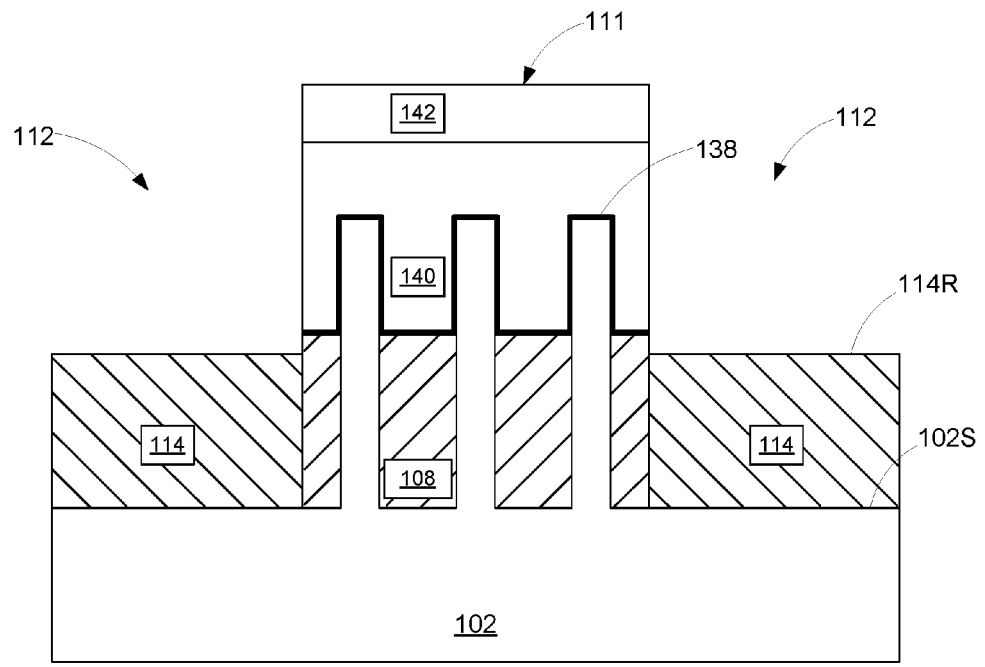

FIG. 3E depicts the product 100 after the above-described timed, recess etching process was performed to recess the layer of insulating material 114 to a desired height level within the isolation region opening 112.

Figure 3F:
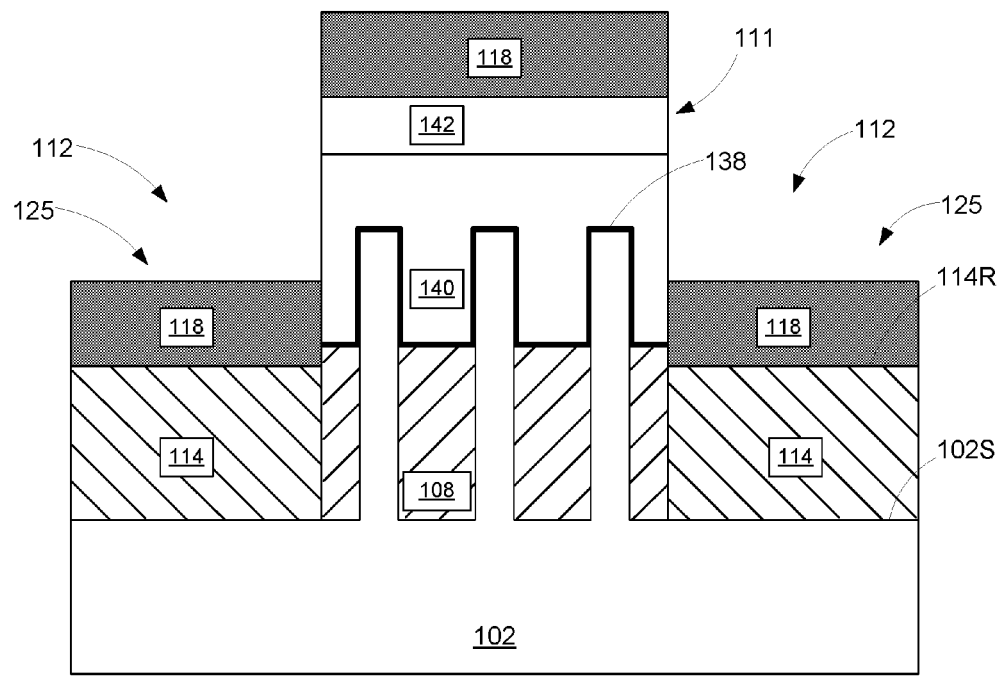

FIG. 3F depicts the product 100 after the above-described directional deposition process, such as a gas cluster ion beam (GCM) process, was performed to form the above-described layer of isolation protection material 118 on the substantially horizontally oriented surfaces, i.e., to form a first portion above the patterned fin masking layer 111 and to form a second portion of the isolation protection material 118 in the isolation region opening 112 above the layer of silicon dioxide 114. In this embodiment, portions of the layer of isolation protection material 118 in the isolation region opening 112 will constitute the isolation protection layer 125 that is positioned above the isolation region 127.

Figure 3G:
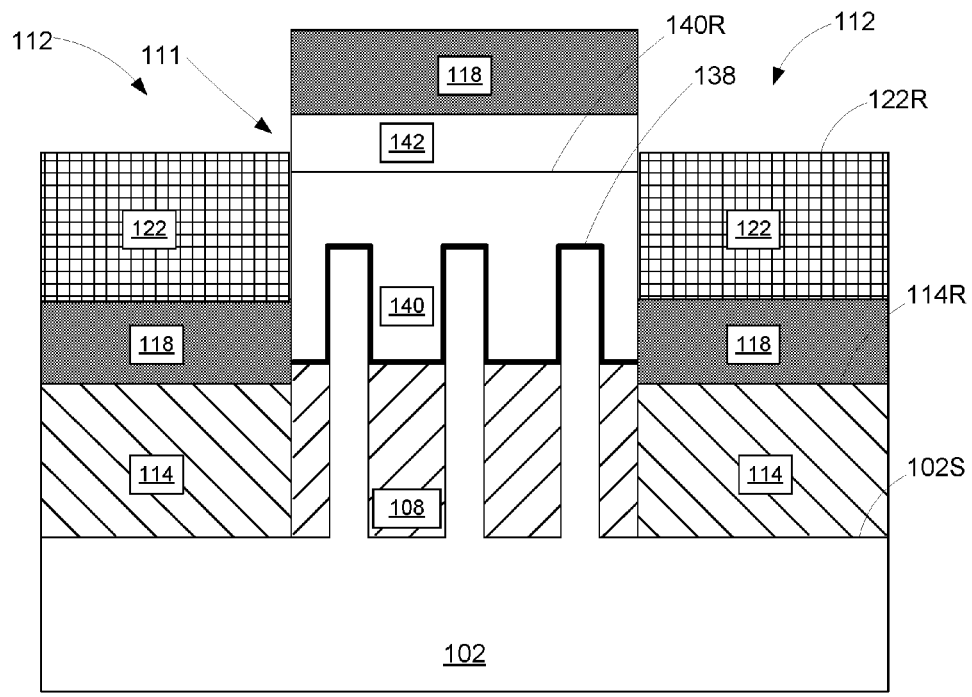

FIG. 3G depicts the product 100 after the above-described layer of masking material 122, such as SOH, OPL, etc., was deposited so as to substantially fill the remaining portions of the isolation region opening 112 and after the above-described timed, recess etching process was performed on the layer of masking material 122 such that it has a recessed upper surface 122R that, in one embodiment, is positioned at a level that is above the upper surface 140R of the layer of sacrificial material 140.

Figure 3H:
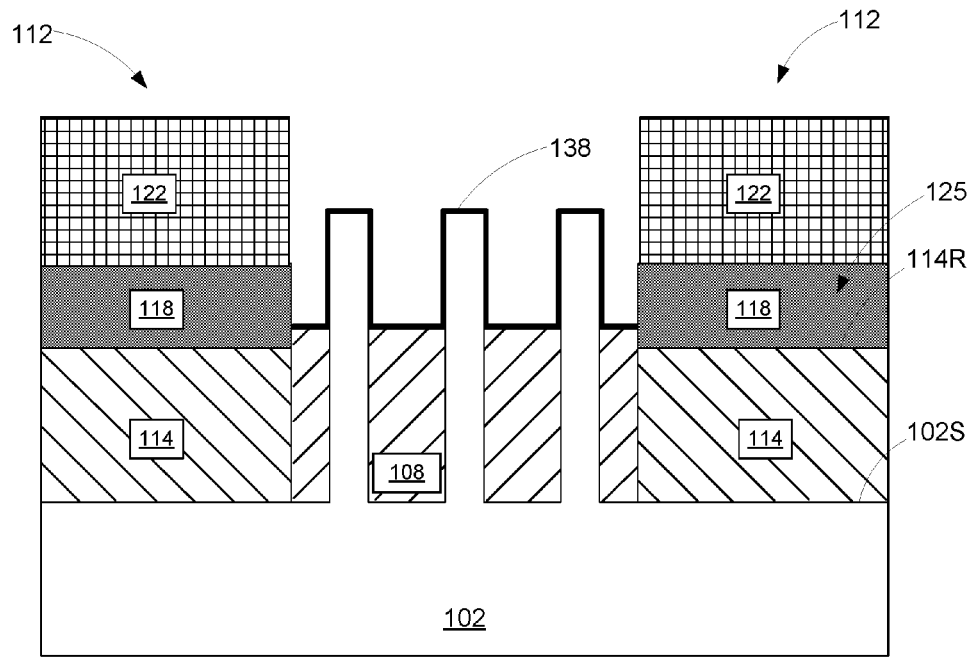

FIG. 3H depicts the product after several process operations were performed. First, an etching process was performed to remove exposed portions of the layer of isolation protection material 118 positioned above the patterned fin masking layer 111 that is positioned above the fins 106A-C. Then, another etching process was performed to remove the layer of sacrificial material 142 selectively relative to the layer of sacrificial material 140. Then, yet another etching process was performed to remove the layer of sacrificial material 140 relative to the conformal layer of silicon dioxide 138.

Figure 3I:
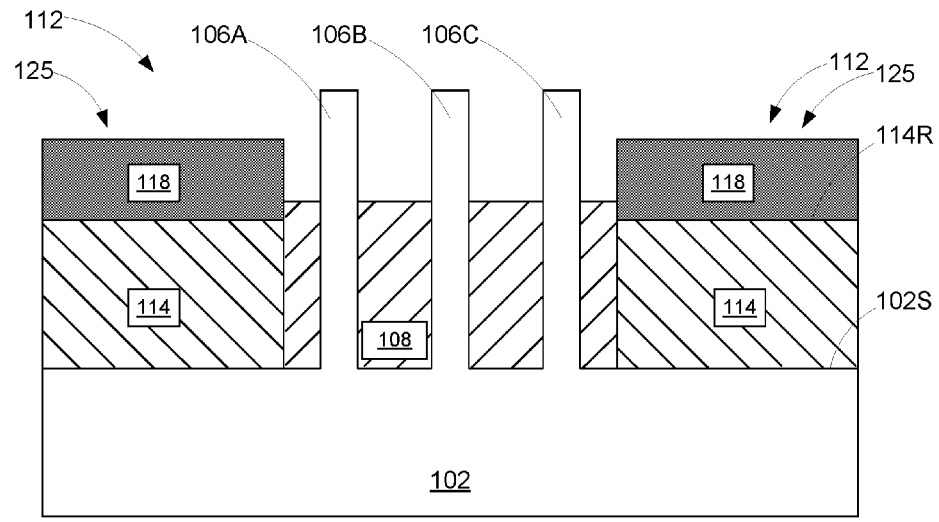

FIG. 3I depicts the product after several process operations were performed. In one embodiment, an etching process was performed to remove the layer of masking material 122 so as to expose the isolation protection layer 125. Then, another etching process was performed to remove the conformal layer of silicon dioxide 138 so as to expose the upper surface and sidewalls of the fins 106A-C. If desired, these etching processes may be performed in any desired order. At this point, the FinFET device may be completed using traditional fabrication techniques. For example, the gate structure 130, the gate cap layer 132 and sidewall spacer 134 depicted in FIG. 2Q may be formed.

Figure 4A:
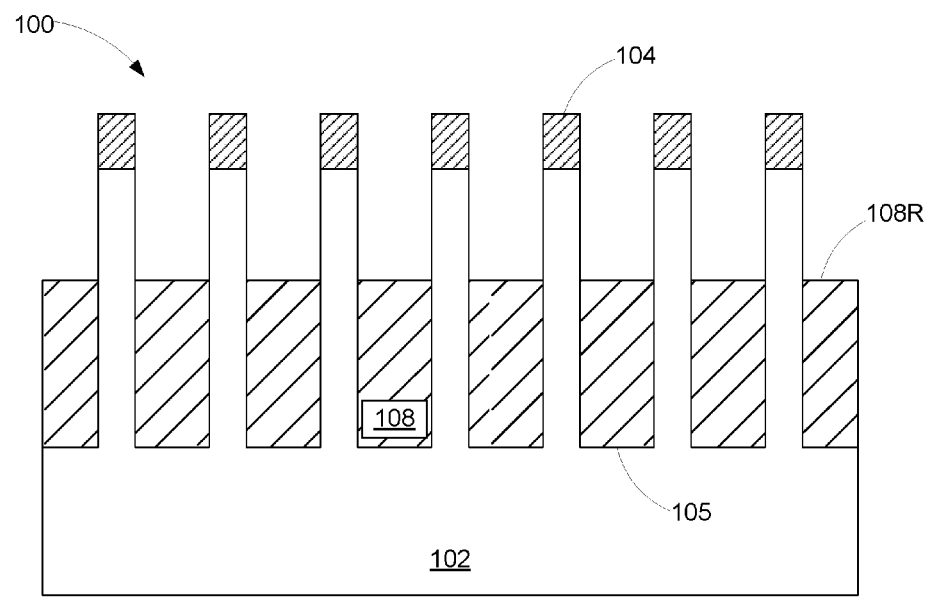
FIGS. 4A-4I depict yet other illustrative novel methods disclosed herein for forming a protection layer on an isolation region of integrated circuit products include FinFET devices.

FIGS. 4A-4I depict yet other illustrative novel methods disclosed herein for forming a protection layer on an isolation region of integrated circuit products that include FinFET devices. FIG. 4A depicts the device at a point in processing that corresponds to that shown in FIG. 2C, i.e., after the above-described timed, recess etching process was performed on the layer of insulating material 108 so as to recess the insulating material 108 to a desired height level within the trenches 105.

Figure 4B:
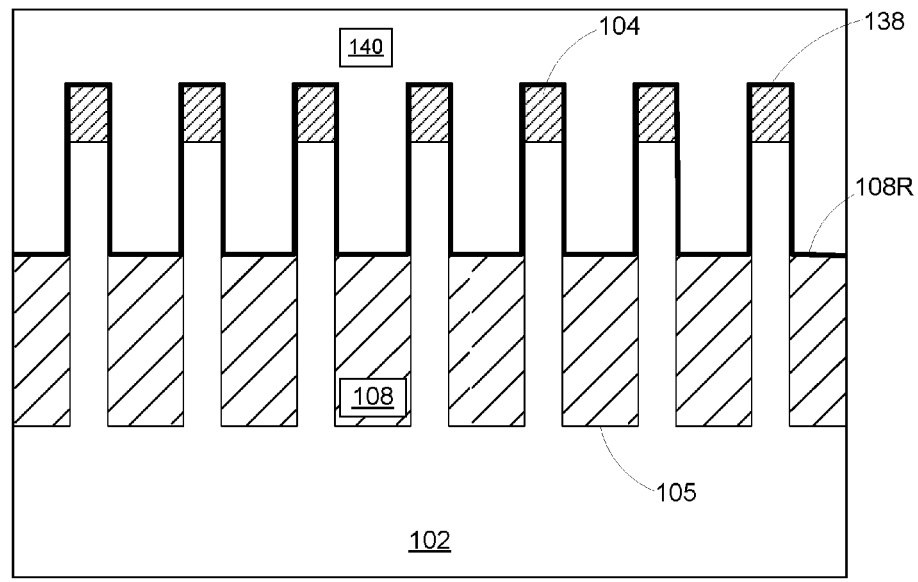

FIG. 4B depicts the product 100 after several process operations were performed. First, a conformal deposition process, such as an ALD process, was performed to form the above-described conformal layer of silicon dioxide 138 around the fins 106 and the patterned fin-formation hard mask 104. Then, the above-described sacrificial layer of material 140 (e.g., silicon nitride) was blanket-deposited across the substrate 102. The material 140 may be formed to any desired thickness.

Figure 4C:
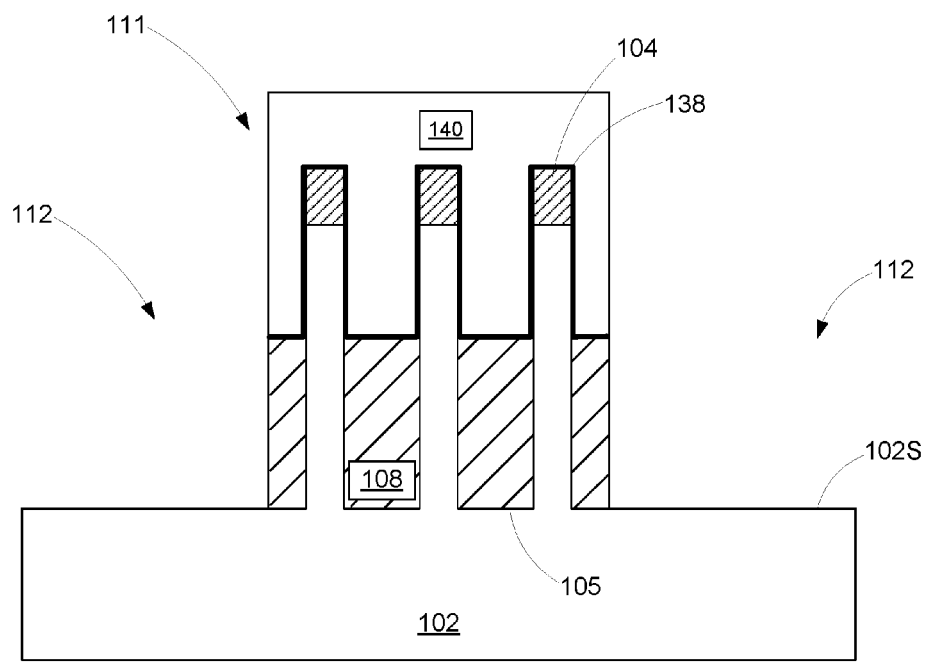

FIG. 4C depicts the product 100 after the above-described masking and etching processes were performed to remove portions of various layers of material and portions of the fins 106 so as to define the isolation region opening 112 where the device isolation structure 127 will be formed around the FinFET device. In this example, a first etching process was performed through a patterned masking layer (not shown), e.g., a patterned layer of photoresist, to remove the exposed portions of sacrificial layer 140. This process operation results in the formation of the patterned fin masking layer 111. In this illustrative embodiment, the patterned fin masking layer 111 may include a portion of the sacrificial layer of material 140. Thereafter, another etching process was performed to remove the exposed portions of the silicon dioxide liner layer 138 so as to expose the portions of the fins 106 that are to be removed. Then, yet another etching process was performed to remove the exposed portions of the fins 106. As before, in this example, the entire vertical height of the exposed portions of the fins 106 was removed. Next, a final etching process was performed to remove the exposed portions of the insulation material 108. The result of all of these process operations is that the isolation region opening 112 for the device isolation region 127 is formed around the perimeter of the FinFET device that exposes portions of the upper surface 102S of the substrate 102.

Figure 4D:
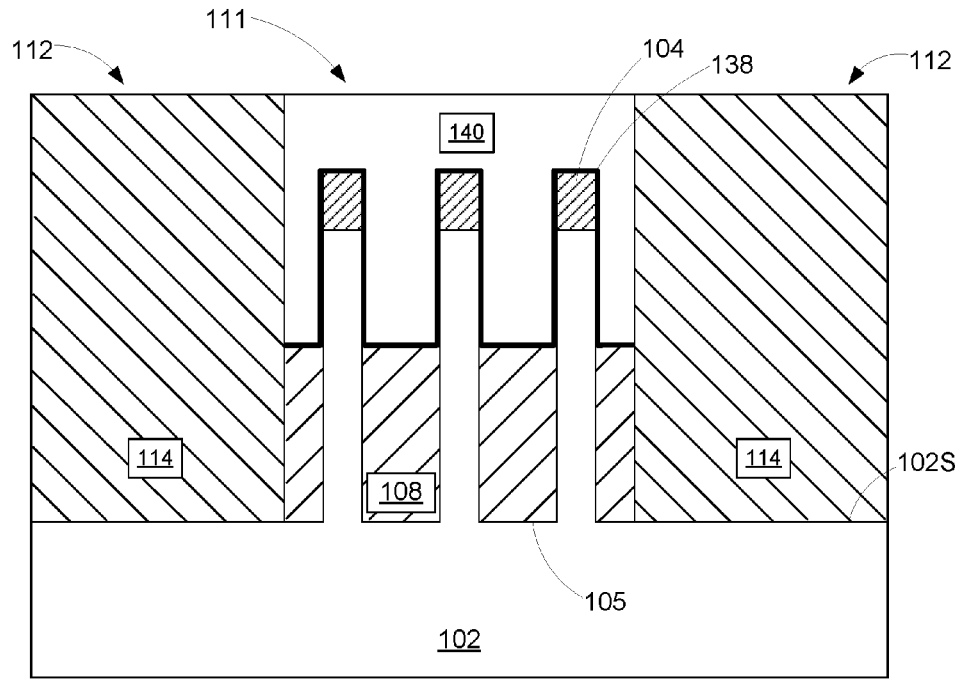

FIG. 4D depicts the product 100 after the above-described layer of insulating material 114 was formed in the isolation region opening 112 and after a CMP process was performed on the layer of insulating material 114 that stopped on the upper surface of the sacrificial layer of material 140.

Figure 4E:
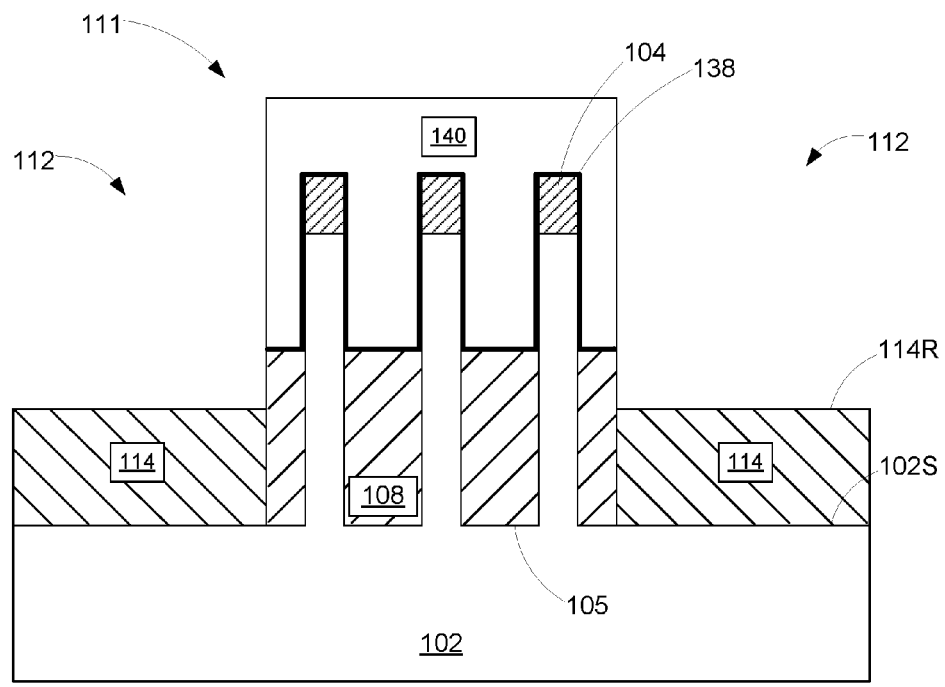

FIG. 4E depicts the product 100 after the above-described timed, recess etching process was performed to recess the layer of insulating material 114 to a desired height level within the isolation region opening 112.

Figure 4F:
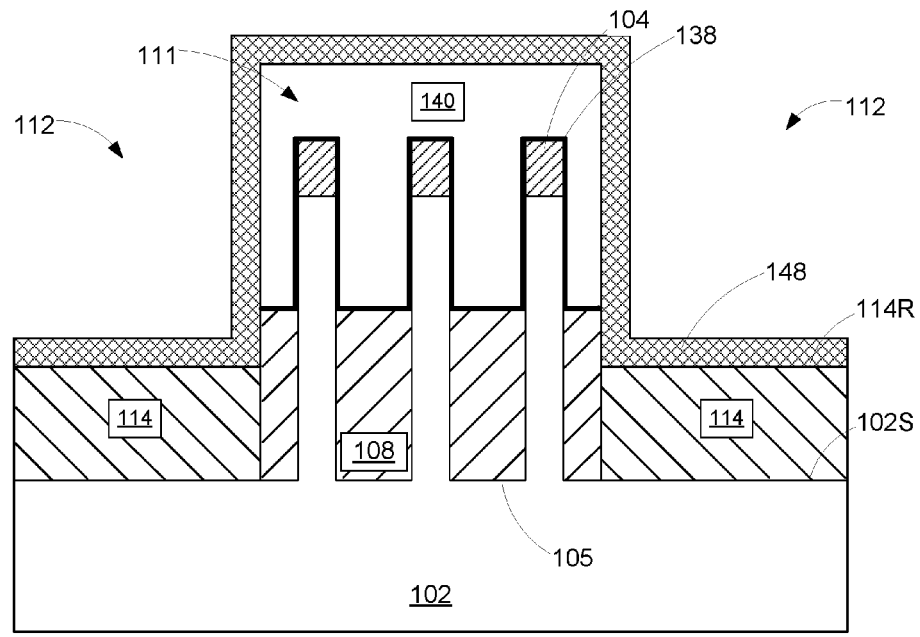

FIG. 4F depicts the product after a conformal deposition process was performed to form a conformal layer of isolation protection material 148 above the patterned fin masking layer 111 and in the openings 112. As described more fully below, after performing additional processing operations, the portions of the conformal layer of isolation protection material 148 in the isolation region opening 112 will constitute the isolation protection layer 125 that is positioned above the isolation region 127. The conformal layer of isolation protection material 148 may be any desired material, e.g., silicon nitride, silicon oxynitride, etc., and it may be formed to any desired thickness, e.g., 15-30 nm.

Figure 4G:
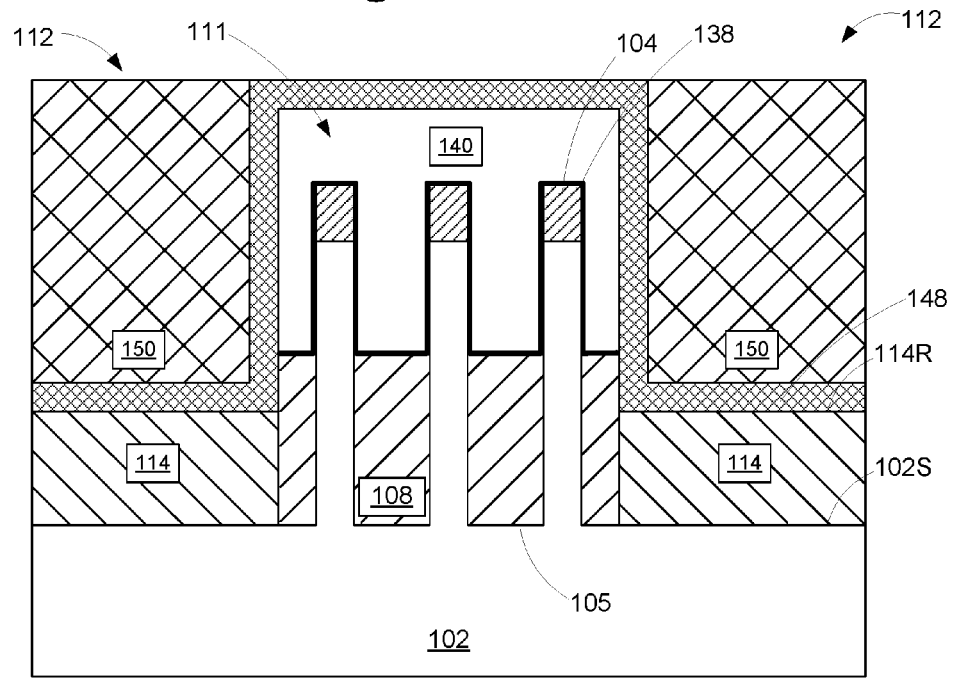

FIG. 4G depicts the product 100 after a layer of masking material 150, such as silicon dioxide, etc., was deposited so as to substantially fill the remaining portions of the isolation region opening 112 and after a CMP process was performed to planarize the upper surface of the layer of masking material 150 with the upper surface of the conformal layer of isolation protection material 148.

Figure 4H:
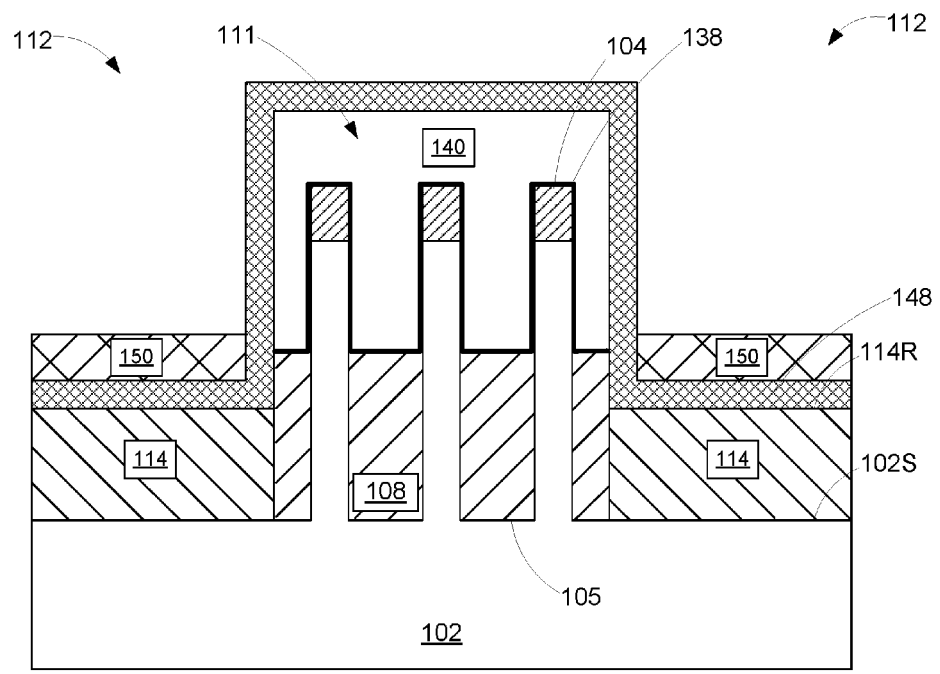

FIG. 4H depicts the product 100 after a timed, recess etching process was performed to recess the layer of masking material 150 (e.g., silicon dioxide) to a desired height level within the isolation region opening 112. In one embodiment, the layer of masking material 150 may be recessed until such time as there is about 15-30 nm of the layer of masking material 150 remaining in the isolation region opening 112 above the conformal layer of isolation protection material 148.

Figure 4I:
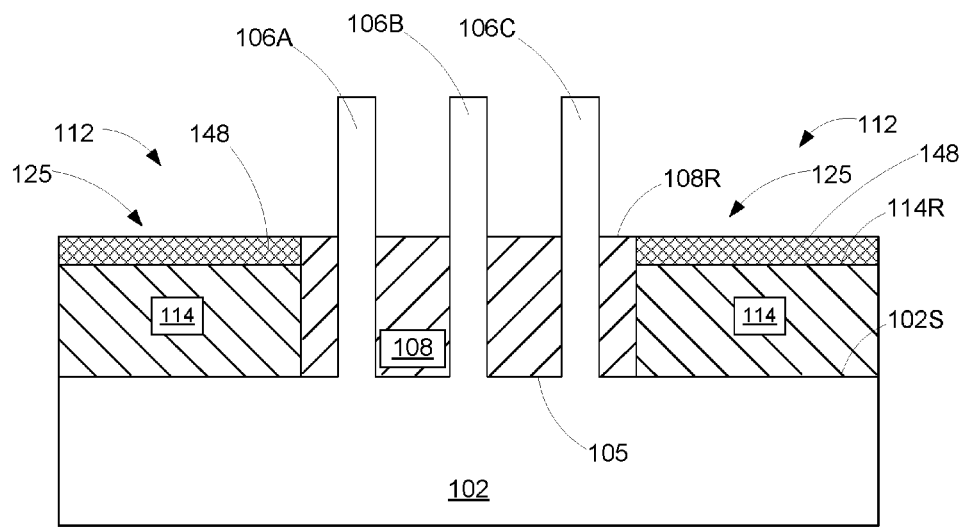

FIG. 4I depicts the product after several process operations were performed. First, an etching process was performed to remove exposed portions of the layer of masking material 150 so as to expose the upper surface and sidewalls of the patterned fin masking layer 111. Then, another etching process was performed to remove the layer of sacrificial material 140 selectively relative to the conformal layer of silicon dioxide 138. Next, another etching process was performed to remove the conformal layer of silicon dioxide 138 and the remaining portions of the layer of masking material 150. The removal of the conformal layer of silicon dioxide 138 exposes the upper surface and sidewalls of the fins 106A-C. As depicted, the remaining portions of the conformal layer of isolation protection material 148 in the isolation region opening 112 constitutes the isolation protection layer 125 that is positioned above the isolation region 127. At this point, the FinFET device may be completed using traditional fabrication techniques. For example, the gate structure 130, the gate cap layer 132 and sidewall spacer 134 depicted in FIG. 2Q may be formed.

Figure 5:
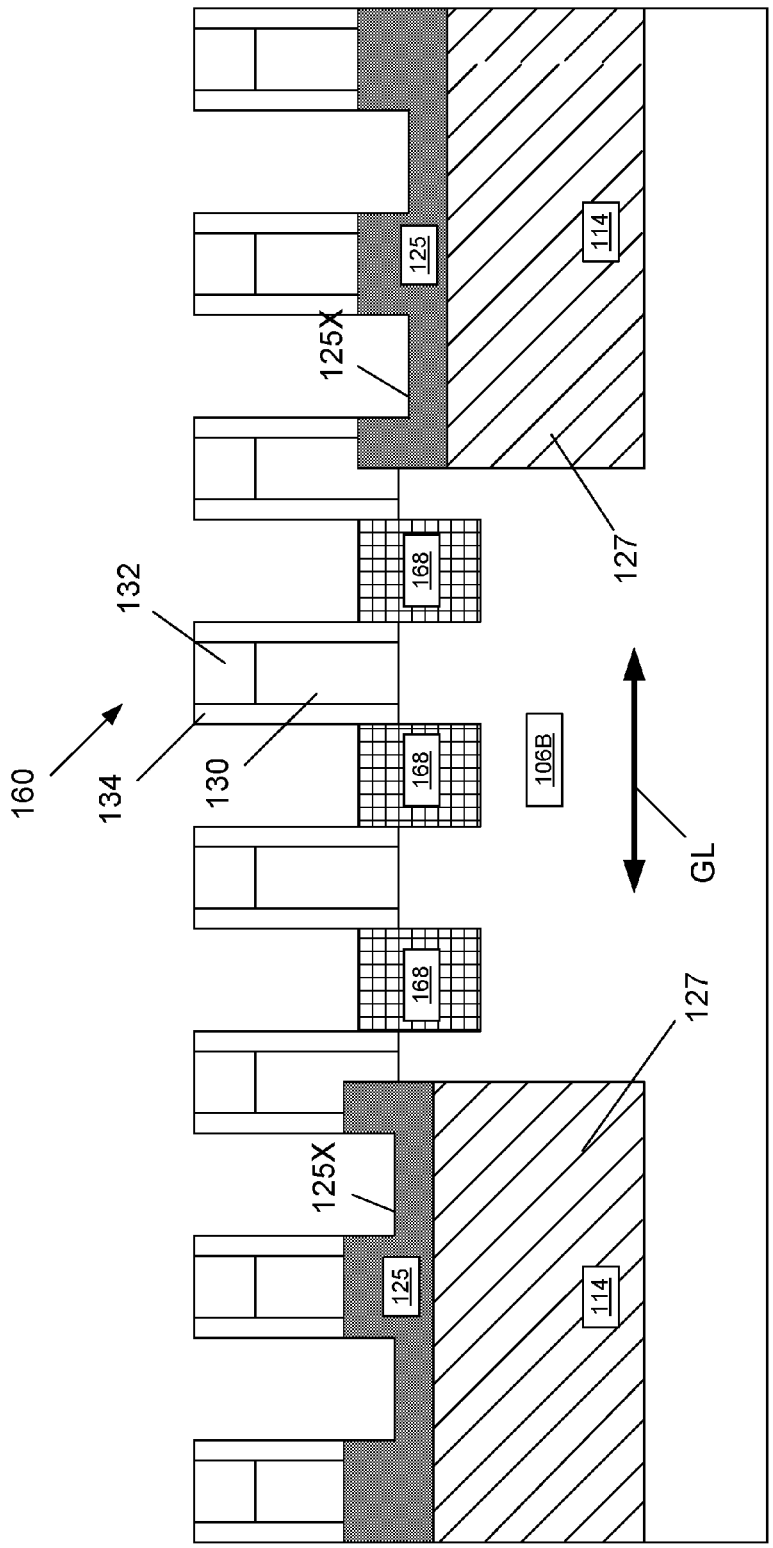
FIG. 5 depicts an illustrative integrated circuit product that includes FinFET devices and an isolation region with one illustrative embodiment of a novel isolation protection layer disclosed herein positioned above the isolation region.

FIG. 5 depicts one illustrative embodiment of an integrated circuit product 100 that includes FinFET devices and an isolation region 127 and one illustrative embodiment of a novel isolation protection layer 125 disclosed herein positioned above the isolation region 127. FIG. 5 is a cross-sectional view taken through the fin 106B and the gate structure 130 in a gate length (GL) direction of the device after several process operations were performed. For example, FIG. 5 depicts the product 100 after the above-described isolation region 127 (including the insulating material 114) and the above-described novel isolation protection layer 125 was formed above the isolation region 127. Thereafter, a plurality of gates 160 were formed across the substrate 102 and above the novel isolation protection layer 125. In one illustrative example, the formation of the gates 160 may involve forming the materials for the gate structures 130 and the gate cap layer 132 across the product 100 and thereafter patterning those materials using traditional masking and etching processes. Thereafter, the sidewall spacer 134 may be formed by performing a conformal deposition process to form a layer of spacer material across the substrate 102 and above the novel isolation protection layer 125 and thereafter performing an anisotropic etching process to remove substantially horizontally positioned portions of the layer of spacer material. As depicted in FIG. 5, in one illustrative embodiment where the sidewall spacer 134 and the isolation protection layer 125 may be of the same (or similar) material(s), such as silicon nitride, a notch or recess 125X is formed in the isolation protection layer 125 when the anisotropic etching process is performed to form the spacer 134 such that the isolation protection layer 125 has a substantially stepped configuration due to the presence of the notch 125X. That is, in the cross-sectional view shown in FIG. 5 (through the gate in the gate length [GL] direction of the device), the portions of the isolation protection layer 125 positioned under the sidewall spacer 134 and the gate structure 130 are thicker than the portions of the isolation protection layer 125 not covered by the spacer 134 and the gate structure 130. As noted above with respect to FIG. 2Q, the isolation protection layer 125 also has this same substantially stepped configuration when viewed in a cross-section taken through the gate in a gate width direction of the device. In this particular example, the isolation protection layer 125 may be silicon nitride so as to protect the underlying silicon dioxide insulation material 114 in the device isolation structure 127 as subsequent processing proceeds on the device, thereby eliminating or at least reducing the formation of the divots in the isolation material as discussed in the background section of this application.

The particular embodiments disclosed above are illustrative only, as the subject matter defined by the appended claims may be modified and practiced in different but equivalent manners apparent to those skilled in the art having the benefit of the teachings herein. For example, some or all of the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the claimed subject matter. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. An integrated circuit product, comprising:
   a FinFET device comprising at least one fin, a gate structure, and a sidewall spacer;
   a device isolation region comprising a first insulating material positioned around a perimeter of said FinFET device; and
   an isolation protection layer positioned above said device isolation region, said isolation protection layer comprising a material that is different from said first insulating material, wherein a first portion of said isolation protection layer is positioned under a portion of said gate structure and under a portion of said sidewall spacer, and wherein a second portion of said isolation protection layer is not positioned under said gate structure and is not positioned under said sidewall spacer, said first portion of said isolation protection layer having a thickness that is greater than a thickness of said second portion.

2. The integrated circuit product of claim 1, wherein said first insulating material comprises silicon dioxide and said isolation protection layer comprises one of silicon nitride and silicon oxynitride.

3. The integrated circuit product of claim 1, further comprising a conformal layer of insulating material positioned between said device isolation region and said isolation protection layer.

4. The integrated circuit product of claim 3, wherein said conformal layer of insulating material comprises silicon dioxide.

5. The integrated circuit product of claim 1, further comprising a recessed layer of a second insulating material positioned under said gate structure and adjacent to said at least one fin.

6. The integrated circuit product of claim 5, wherein said first and second insulating materials comprise silicon dioxide.

7. The integrated circuit product of claim 5, wherein said first and second insulating materials comprise different insulating materials.

8. The integrated circuit product of claim 1, wherein, when viewed in a cross-section taken through said gate structure and said isolation protection layer in a direction corresponding to a gate width direction of said FinFET device, said isolation protection layer has a substantially stepped cross-sectional profile.

9. The integrated circuit product of claim 1, wherein, when viewed in a cross-section taken through said gate structure and said isolation protection layer in a direction corresponding to a gate length direction of said FinFET device, said isolation protection layer has a substantially stepped cross-sectional profile.

10. An integrated circuit product, comprising:
    a FinFET device comprising at least one fin, a gate structure positioned on said at least one fin, and a sidewall spacer positioned adjacent to said gate structure;
    a device isolation region positioned around a perimeter of said FinFET device, said device isolation structure comprising a first insulating material; and an isolation protection layer that is positioned above said device isolation region, said isolation protection layer comprising a material that is different from said first insulating material, wherein a first portion of said isolation protection layer is positioned under a portion of said gate structure and under a portion of said sidewall spacer, and wherein a second portion of said isolation protection layer is not positioned under said gate structure and is not positioned under said sidewall spacer, said isolation protection layer having a substantially stepped cross-sectional profile such that a thickness of said first portion of said isolation protection layer is greater than a thickness of said second portion.

11. The integrated circuit product of claim 10, wherein said first insulating material comprises silicon dioxide and said isolation protection layer comprises one of silicon nitride and silicon oxynitride.

12. The integrated circuit product of claim 10, further comprising a conformal layer of insulating material positioned between said device isolation region and said isolation protection layer.

13. The integrated circuit product of claim 12, wherein said conformal layer of insulating material comprises silicon dioxide.

14. The integrated circuit product of claim 10, further comprising a recessed layer of a second insulating material positioned under said gate structure and adjacent to said at least one fin.

15. The integrated circuit product of claim 14, wherein said first and second insulating materials comprise silicon dioxide.

16. The integrated circuit product of claim 14, wherein said first and second insulating materials comprise different insulating materials.

17. The integrated circuit product of claim 10, wherein said isolation protection layer has said substantially stepped cross-sectional profile when viewed in a cross-section taken through said gate structure and said isolation protection layer in a gate width direction of said FinFET device.

18. The integrated circuit product of claim 17, wherein said isolation protection layer has said substantially stepped cross-sectional profile when viewed in a cross-section taken through said gate structure and said isolation protection layer in a gate length direction of said FinFET device.

19. An integrated circuit product, comprising:
  a FinFET device comprising at least one fin, a gate structure positioned on said at least one fin, and a sidewall spacer positioned adjacent to said gate structure;
  a recessed layer of a first insulating material positioned under said gate structure and adjacent to said at least one fin;
  a device isolation region positioned around a perimeter of said FinFET device, said device isolation structure comprising a second insulating material;
  an isolation protection layer that is positioned above said device isolation region, said isolation protection layer comprising a material that is different from said second insulating material, wherein a first portion of said isolation protection layer is positioned under a portion of said gate structure and under a portion of said sidewall spacer, and wherein a second portion of said isolation protection layer is not positioned under said gate structure and is not positioned under said sidewall spacer, said isolation protection layer having a substantially stepped cross-sectional profile when viewed in cross-sections that are taken through said gate structure and said isolation protection layer in both a gate width direction and a gate length direction of said FinFET device.

20. The integrated circuit product of claim 19, wherein a thickness of said first portion of said isolation protection layer is greater than a thickness of said second portion of said isolation protection layer.

* * * * *